United States Patent
Jeong et al.

(10) Patent No.: US 11,115,064 B2
(45) Date of Patent: Sep. 7, 2021

(54) ERROR CORRECTION DECODER AND MEMORY SYSTEM HAVING THE SAME

(71) Applicant: SK hynix Inc., Icheon-si (KR)

(72) Inventors: Bo Seok Jeong, Incheon (KR); Soon Young Kang, Yongin-si (KR); Dae Sung Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 92 days.

(21) Appl. No.: 16/590,222

(22) Filed: Oct. 1, 2019

(65) Prior Publication Data

US 2020/0304155 A1    Sep. 24, 2020

(30) Foreign Application Priority Data

Mar. 19, 2019    (KR) .................. 10-2019-0031293

(51) Int. Cl.
*H03M 13/37*    (2006.01)
*H03M 13/45*    (2006.01)
*G06F 11/10*    (2006.01)

(52) U.S. Cl.
CPC ..... *H03M 13/3753* (2013.01); *G06F 11/1068* (2013.01); *H03M 13/458* (2013.01)

(58) Field of Classification Search
CPC ......... H03M 13/3753; H03M 13/1108; H03M 13/1111
See application file for complete search history.

(56) References Cited

U.S. PATENT DOCUMENTS

| | | | |
|---|---|---|---|
| 8,266,493 B1* | 9/2012 | Abbaszadeh | H03M 13/116 714/752 |
| 10,200,064 B1* | 2/2019 | Varnica | H03M 13/116 |
| 10,892,776 B1* | 1/2021 | Kuo | G06F 11/1068 |
| 10,951,232 B2* | 3/2021 | Kwak | G06F 11/1068 |
| 2014/0229792 A1* | 8/2014 | Varnica | H03M 13/1108 714/759 |
| 2015/0082126 A1* | 3/2015 | Vernon | H03M 13/1108 714/774 |
| 2015/0092290 A1* | 4/2015 | Liu | H03M 13/1117 360/47 |
| 2015/0286523 A1* | 10/2015 | Cai | H03M 13/6325 714/807 |

(Continued)

FOREIGN PATENT DOCUMENTS

KR    10-1718543    3/2017

*Primary Examiner* — Steve N Nguyen
(74) *Attorney, Agent, or Firm* — Perkins Coie LLP

(57) ABSTRACT

Provided herein is an error correction decoder and a memory system having the same. The error correction decoder includes a memory configured to store a hard decision value of a variable node. The decoder further includes a flipping function value generator configured to generate, in an i-th iteration, a first value based on a number of unsatisfied check nodes (UCNs) corresponding to the variable node, and to generate a flipping function value as (i) a difference between the first value and an offset value or (ii) a set value, wherein i is a non-negative integer. The decoder also includes a comparator configured to output, in the i-th iteration, a first signal indicating whether to flip or not flip the hard decision value of the variable node in the memory based on comparing the flipping function value to a flipping threshold value.

10 Claims, 19 Drawing Sheets

(56) References Cited

U.S. PATENT DOCUMENTS

2016/0087653 A1* 3/2016 Yang ................ G11B 20/1833
　　　　　　　　　　　　　　　　　　　　714/752
2018/0131389 A1　5/2018 Xiong et al.
2018/0226999 A1* 8/2018 Wang .................... H04L 1/0064
2019/0149168 A1* 5/2019 Chang ................ H03M 13/1108
　　　　　　　　　　　　　　　　　　　　714/752

* cited by examiner $$H = \begin{bmatrix} 1 & 0 & 1 & 0 & 1 & 0 & 0 \\ 0 & 1 & 0 & 1 & 0 & 1 & 0 \\ 1 & 0 & 0 & 1 & 0 & 0 & 1 \end{bmatrix}$$

$$\begin{bmatrix} 1 & 0 & 1 & 0 & 1 & 0 & 0 \\ 0 & 1 & 0 & 1 & 0 & 1 & 0 \\ 1 & 0 & 0 & 1 & 0 & 0 & 1 \end{bmatrix} \times \begin{bmatrix} c_{i1} \\ c_{i2} \\ c_{i3} \\ \vdots \\ c_{i7} \end{bmatrix} = \begin{bmatrix} s_{i1} \\ s_{i2} \\ s_{i3} \end{bmatrix}$$

$$H \qquad\qquad C_i^T \qquad\qquad S_i$$

FIG. 10

| Degree of VN (D) $(2^{(q-1)}-1 < D \leq 2^q-1)$ | | Offset value | Flipping function value (FFV) |
|---|---|---|---|
| q=4 | 15 | 8 | $0 \leq FFV \leq 7$ |
| | 14 | 7 | $0 \leq FFV \leq 7$ |
| | 13 | 6 | $0 \leq FFV \leq 7$ |
| | 12 | 5 | $0 \leq FFV \leq 7$ |
| | 11 | 4 | $0 \leq FFV \leq 7$ |
| | 10 | 3 | $0 \leq FFV \leq 7$ |
| | 9 | 2 | $0 \leq FFV \leq 7$ |
| | 8 | 1 | $0 \leq FFV \leq 7$ |
| q=3 | 7 | 4 | $0 \leq FFV \leq 3$ |
| | 6 | 3 | $0 \leq FFV \leq 3$ |
| | 5 | 2 | $0 \leq FFV \leq 3$ |
| | 4 | 1 | $0 \leq FFV \leq 3$ |
| q=2 | 3 | 2 | $0 \leq FFV \leq 1$ |
| | 2 | 1 | $0 \leq FFV \leq 1$ |

| #UCN | Flipping function value (FFV) |
|---|---|
| 7 | 3 |
| 6 | 2 |
| 5 | 1 |
| 4 | 0 |
| 3 | 0 |
| 2 | 0 |
| 1 | 0 |
| 0 | 0 |

2bits

| #UCN | Flipping function value (FFV) |
|---|---|
| 4 | 3 |
| 3 | 2 |
| 2 | 1 |
| 1 | 0 |
| 0 | 0 |

2bits

FIG. 13

| Degree of VN (D)<br>($2^{(q-1)}-2 < D \leq 2^q-2$) | Flipping function value (FFV) |
|---|---|
| q=4 | |
| 14 | $0 \leq FFV \leq 15$ |
| 13 | $0 \leq FFV \leq 14$ |
| 12 | $0 \leq FFV \leq 13$ |
| 11 | $0 \leq FFV \leq 12$ |
| 10 | $0 \leq FFV \leq 11$ |
| 9 | $0 \leq FFV \leq 10$ |
| 8 | $0 \leq FFV \leq 9$ |
| 7 | $0 \leq FFV \leq 8$ |
| q=3 | |
| 6 | $0 \leq FFV \leq 7$ |
| 5 | $0 \leq FFV \leq 6$ |
| 4 | $0 \leq FFV \leq 5$ |
| 3 | $0 \leq FFV \leq 4$ |
| q=2 | |
| 2 | $0 \leq FFV \leq 3$ |
| 1 | $0 \leq FFV \leq 2$ |

| #UCN | Flipping function value (FFV) |
|---|---|
| 6 | 6 or 7 |
| 5 | 5 or 6 |
| 4 | 4 or 5 |
| 3 | 3 or 4 |
| 2 | 2 or 3 |
| 1 | 1 or 2 |
| 0 | 0 or 1 |

3bits

| #UCN | Flipping function value (FFV) |
|---|---|
| 3 | 3 or 4 |
| 2 | 2 or 3 |
| 1 | 1 or 2 |
| 0 | 0 or 1 |

3bits

FIG. 14

| Degree of VN (D) $(2^{(q-1)}-2 < D \leq 2^q-2)$ | | Flipping function value (FFV) |
|---|---|---|
| q=4 | 14 | $-15 \leq FFV \leq 15$ |
| | 13 | $-14 \leq FFV \leq 14$ |
| | 12 | $-13 \leq FFV \leq 13$ |
| | 11 | $-12 \leq FFV \leq 12$ |
| | 10 | $-11 \leq FFV \leq 11$ |
| | 9 | $-10 \leq FFV \leq 10$ |
| | 8 | $-9 \leq FFV \leq 9$ |
| | 7 | $-8 \leq FFV \leq 8$ |
| q=3 | 6 | $-7 \leq FFV \leq 7$ |
| | 5 | $-6 \leq FFV \leq 6$ |
| | 4 | $-5 \leq FFV \leq 5$ |
| | 3 | $-4 \leq FFV \leq 4$ |
| q=2 | 2 | $-3 \leq FFV \leq 3$ |
| | 1 | $-2 \leq FFV \leq 2$ |

| #UCN | #SCN | #UCN−#SCN | Flipping function value (FFV) |
|---|---|---|---|
| 6 | 0 | 6 | 5 or 7 |
| 5 | 1 | 4 | 3 or 5 |
| 4 | 2 | 2 | 1 or 3 |
| 3 | 3 | 0 | −1 or 1 |
| 2 | 4 | −2 | −3 or −1 |
| 1 | 5 | −4 | −5 or −3 |
| 0 | 6 | −6 | −7 or −5 |

4bits

| #UCN | #SCN | #UCN−#SCN | Flipping function value (FFV) |
|---|---|---|---|
| 3 | 0 | 3 | 2 or 4 |
| 2 | 1 | 1 | 0 or 2 |
| 1 | 2 | −1 | −2 or 0 |
| 0 | 3 | −3 | −4 or −2 |

4bits

FIG. 16

| Degree of VN (D) $(2^{(q-1)}-2 < D \le 2^q-2)$ | Offset value | Flipping function value (FFV) | |
|---|---|---|---|
| 14 | 8 | $0 \le FFV \le 7$ | |
| 13 | 7 | $0 \le FFV \le 7$ | |
| 12 | 6 | $0 \le FFV \le 7$ | q=4 |
| 11 | 5 | $0 \le FFV \le 7$ | |
| 10 | 4 | $0 \le FFV \le 7$ | |
| 9 | 3 | $0 \le FFV \le 7$ | |
| 8 | 2 | $0 \le FFV \le 7$ | |
| 7 | 1 | $0 \le FFV \le 7$ | |
| 6 | 4 | $0 \le FFV \le 3$ | |
| 5 | 3 | $0 \le FFV \le 3$ | q=3 |
| 4 | 2 | $0 \le FFV \le 3$ | |
| 3 | 1 | $0 \le FFV \le 3$ | |
| 2 | 2 | $0 \le FFV \le 1$ | q=2 |
| 1 | 1 | $0 \le FFV \le 1$ | |

| #UCN | Flipping function value (FFV) |
|---|---|
| 6 | 2 or 3 |
| 5 | 1 or 2 |
| 4 | 0 or 1 |
| 3 | 0 |
| 2 | 0 |
| 1 | 0 |
| 0 | 0 |

2bits

| #UCN | Flipping function value (FFV) |
|---|---|
| 3 | 2 or 3 |
| 2 | 1 or 2 |
| 1 | 0 or 1 |
| 0 | 0 |

2bits

FIG. 17

| Degree of VN (D) $(2^{(q-1)}-2 < D \leq 2^q-2)$ | | Reference value | Flipping function value (FFV) |
|---|---|---|---|
| q=4 | 14 | 0 | $0 \leq FFV \leq 15$ |
| | 13 | 0 | $0 \leq FFV \leq 14$ |
| | 12 | 0 | $0 \leq FFV \leq 13$ |
| | 11 | 0 | $0 \leq FFV \leq 12$ |
| | 10 | 0 | $0 \leq FFV \leq 11$ |
| | 9 | 0 | $0 \leq FFV \leq 10$ |
| | 8 | 0 | $0 \leq FFV \leq 9$ |
| | 7 | 0 | $0 \leq FFV \leq 8$ |
| q=3 | 6 | 0 | $0 \leq FFV \leq 7$ |
| | 5 | 0 | $0 \leq FFV \leq 6$ |
| | 4 | 0 | $0 \leq FFV \leq 5$ |
| | 3 | 0 | $0 \leq FFV \leq 4$ |
| q=2 | 2 | 0 | $0 \leq FFV \leq 3$ |
| | 1 | 0 | $0 \leq FFV \leq 2$ |

| #UCN | #SCN | #UCN−#SCN | Flipping function value (FFV) |
|---|---|---|---|
| 6 | 0 | 6 | 5 or 7 |
| 5 | 1 | 4 | 3 or 5 |
| 4 | 2 | 2 | 1 or 3 |
| 3 | 3 | 0 | 0 or 1 |
| 2 | 4 | −2 | 0 |
| 1 | 5 | −4 | 0 |
| 0 | 6 | −6 | 0 |

⎫ 3bits

| #UCN | #SCN | #UCN−#SCN | Flipping function value (FFV) |
|---|---|---|---|
| 3 | 0 | 3 | 2 or 4 |
| 2 | 1 | 1 | 0 or 2 |
| 1 | 2 | −1 | 0 |
| 0 | 3 | −3 | 0 |

⎫ 3bits

ERROR CORRECTION DECODER AND MEMORY SYSTEM HAVING THE SAME

CROSS-REFERENCE TO RELATED APPLICATION

This patent document claims priority to and benefits of the Korean patent application number 10-2019-0031293, filed on Mar. 19, 2019, which is incorporated herein by reference in its entirety for all purposes.

TECHNICAL FIELD

Various embodiments of the present disclosure generally relate to memory storage devices, and more particularly, to an error correction decoder and a memory system having the error correction decoder.

BACKGROUND

A memory system may include storage media which temporarily or permanently store data. In a memory system, errors may be caused due to interference between adjacent memory cells or data corruption occurring during writing, reading, transmission or processing.

In order to ensure the reliability of data, error correction techniques, such as error correction encoding and error correction decoding, may be applied to the memory system. Such an error correction technique may be implemented in the form of hardware or software.

SUMMARY

Various embodiments of the present disclosure are directed to an error correction decoder that can improve hardware complexity and a memory system having the error correction decoder.

Various embodiments of the present disclosure are directed to an error correction decoder that can reduce power consumption and a memory system having the error correction decoder.

An embodiment of the present disclosure may provide for an error correction decoder for performing error correction decoding using an iterative decoding scheme. The error correction decoder may include a memory configured to store a hard decision value of a variable node; a flipping function value generator configured to generate, in an i-th iteration, a first value based on a number of unsatisfied check nodes (UCNs) corresponding to the variable node, and generate a flipping function value as (i) a difference between the first value and an offset value or (ii) a set value, wherein i is a non-negative integer; and a comparator configured to output, in the i-th iteration, a first signal indicating whether to flip or not flip the hard decision value of the variable node in the memory based on comparing the flipping function value to a flipping threshold value.

In some embodiments, the flipping function value generator is configured to generate the number of UCNs as the first value, and wherein the offset value is set such that, in accordance with the variable node, a degree of which is greater than $2(q-1)-1$ and is less than or equal to $2q-1$ (where q is a natural number of 2 or more), a flipping function value having a value of at most $2(q-p)-1$ (where p is a natural number less than q) is capable of being generated.

The flipping function value generator may include a modulo calculator configured to generate a second value by performing a modulo-2 operation between a channel value corresponding to the variable node and the hard decision value of the variable node, stored in the memory; and an arithmetic calculator configured to generate the first value by adding the second value to the number of UCNs, wherein the offset value is set such that, in accordance with the variable node, a degree of which is greater than $2(q-1)-2$ and is less than or equal to $2q-2$ (where q is a natural number of 2 or more), a flipping function value having a value of at most $2(q-p)-1$ (where p is a natural number less than q) is capable of being generated.

An embodiment of the present disclosure may provide for an error correction decoder for performing error correction decoding using an iterative decoding scheme. The error correction decoder may include a memory configured to store a hard decision value of a variable node; a flipping function value generator configured to generate, in an i-th iteration, a first value based on a difference between a number of unsatisfied check nodes (UCNs) corresponding to the variable node and a number of satisfied check nodes (SCNs) corresponding to the variable node, and generate a flipping function value by selectively updating the first value based on a comparison of the first value to a reference value; and a comparator configured to output, in the i-th iteration, a first signal indicating whether to flip or not flip the hard decision value of the variable node in the memory based on comparing the flipping function value to a flipping threshold value.

In an embodiment, the flipping function value generator is configured to generate a value, obtained by subtracting the number of SCNs from the number of UCNs, as the first value, and wherein the flipping function value is generated to have a value that is equal to or greater than the reference value and is less than or equal to $2q-1$ (where q is a natural number of 2 or more) in accordance with the variable node, a degree of which is greater than $2(q-1)-1$ and is less than or equal to $2q-1$.

In an embodiment, the flipping function value generator may include a modulo calculator configured to generate a second value by performing a modulo-2 operation between a channel value corresponding to the variable node and the hard decision value of the variable node, stored in the memory; and an arithmetic calculator configured to generate, upon a determination that the second value is 1, the first value by adding 1 to a value, obtained by subtracting the number of SCNs from the number of UCNs, and upon a determination that the second value is 0, generate the first value by adding -1 to the value, obtained by subtracting the number of SCNs from the number of UCNs, wherein the flipping function value is generated to have a value that is equal to or greater than the reference value and is less than or equal to $2q-1$ in accordance with the variable node, a degree of which is greater than $2(q-1)-2$ and is less than or equal to $2q-2$ (where q is a natural number of 2 or more).

An embodiment of the present disclosure may provide for a memory system. The memory system may include a memory device; and a memory controller including a processor configured to receive read values from the memory device and perform error correction decoding based on an iterative decoding scheme based on the received read values, wherein the processor comprises: a memory configured to store a hard decision value of a variable node; a flipping function value generator configured to generate, in an i-th iteration, a first value based on a difference between a number of unsatisfied check nodes (UCNs) corresponding to the variable node and a number of satisfied check nodes (SCNs) corresponding to the variable node, and generate a flipping function value by selectively updating the first value based on a comparison of the first value to a reference value; and a comparator configured to output, in the i-th iteration, a signal indicating whether to flip or not flip the hard decision value of the variable node in the memory based on a comparison between the flipping function value and a flipping threshold value.

An embodiment of the present disclosure may provide for an error correction decoder for performing error correction decoding using an iterative decoding scheme. The error correction decoder may include a first storage configured to store a hard decision value of a variable node; a flipping function value generator configured to, in an i-th iteration (where i is a natural number), generate a first value based on a number of Unsatisfied Check Nodes (UCNs) corresponding to the variable node, and generate a flipping function value by applying an offset value to the first value; and a comparator configured to, in the i-th iteration, compare a flipping threshold value with the flipping function value received from the flipping function value generator, and output a signal instructing flipping or non-flipping of the hard decision value of the variable node to the first storage depending on a result of the comparison, wherein the flipping function value generator generates a difference between the first value and the offset value as the flipping function value or generates a set value as the flipping function value, and wherein the comparator skips the comparison with the flipping threshold value when the received flipping function value is equal to the set value.

An embodiment of the present disclosure may provide for an error correction decoder for performing error correction decoding using an iterative decoding scheme. The error correction decoder may include a first storage configured to store a hard decision value of a variable node; a flipping function value generator configured to, in an i-th iteration (where i is a natural number), generate a first value based on a difference between a number of Unsatisfied Check Nodes (UCNs) corresponding to the variable node and a number of Satisfied Check Nodes (SCNs) corresponding to the variable node, and generate a flipping function value by changing the first value depending on whether the first value is less than a reference value; and a comparator configured to, in the i-th iteration, compare a flipping threshold value with the flipping function value received from the flipping function value generator, and output a signal instructing flipping or non-flipping of the hard decision value of the variable node to the first storage depending on a result of the comparison, wherein the comparator skips the comparison with the flipping threshold value when the received flipping function value is equal to the reference value.

An embodiment of the present disclosure may provide for a memory system. The memory system may include a memory device; and a memory controller including a node processor configured to receive read values from the memory device and perform error correction decoding based on an iterative decoding scheme based on the received read values, wherein the node processor comprises: a first storage configured to store a hard decision value of a variable node; a flipping function value generator configured to, in an i-th iteration (where i is a natural number), generate a first value based on a difference between a number of Unsatisfied Check Nodes (UCNs) corresponding to the variable node and a number of Satisfied Check Nodes (SCNs) corresponding to the variable node, and generate a flipping function value by changing the first value depending on whether the first value is less than a reference value; and a comparator configured to, in the i-th iteration, compare a flipping threshold value with the flipping function value received from the flipping function value generator, and output a signal instructing flipping or non-flipping of the hard decision value of the variable node to the first storage depending on a result of the comparison, wherein the comparator skips the comparison with the flipping threshold value when the received flipping function value is equal to the reference value.

BRIEF DESCRIPTION OF THE DRAWINGS

FIG. 10 is a diagram illustrating the operation of an example flipping function value and an offset value according to an embodiment of the present disclosure.

FIG. 13 is a diagram illustrating the operation of yet another example flipping function value according to an embodiment of the present disclosure.

FIG. 14 is a diagram illustrating the operation of yet another example flipping function value according to an embodiment of the present disclosure.

FIG. 16 is a diagram illustrating the operation of another example flipping function value and an offset value according to an embodiment of the present disclosure.

FIG. 17 is a diagram illustrating the operation of another example flipping function value and a reference value according to an embodiment of the present disclosure.

DETAILED DESCRIPTION

Section headings are used in the present document for ease of understanding and do not limit the embodiments and techniques to the corresponding sections. As such, embodiments from one section can be combined with embodiments from other sections.

Figure 1:
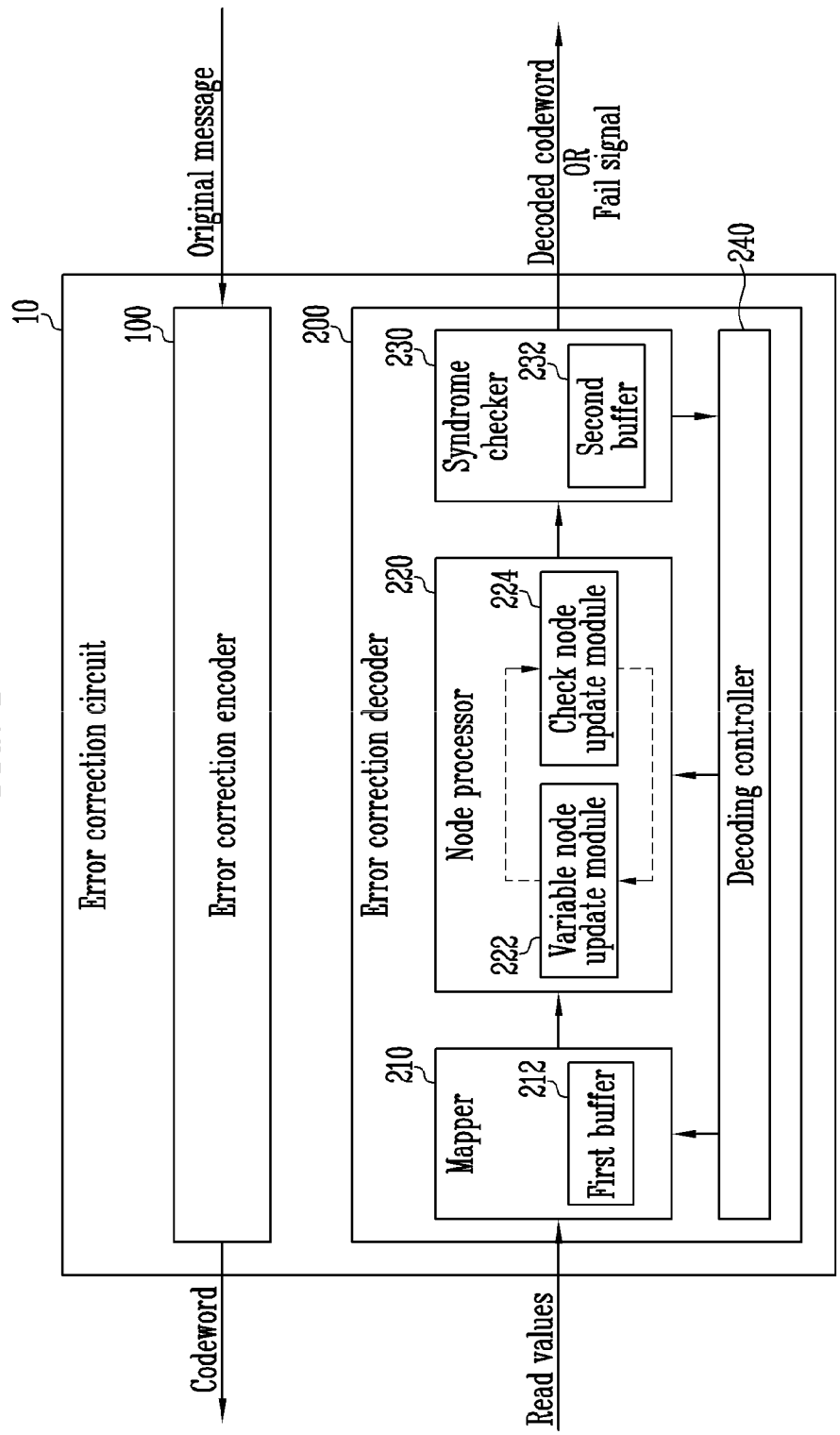
FIG. 1 is a diagram illustrating an error correction circuit according to an embodiment of the present disclosure.

FIG. 1 is a diagram illustrating an example of an error correction circuit according to an embodiment of the present disclosure.

Referring to FIG. 1, an error correction circuit 10 may include an error correction encoder 100 and an error correction decoder 200.

The error correction encoder 100 may receive an original message that is intended to be encoded, and may perform error correction encoding using the received original message and a generator matrix of an error correction code (ECC). In some embodiments, the error correction encoder 100 may also perform error correction encoding using the received original message and a parity check matrix of the error correction code.

The error correction encoder 100 outputs a codeword, generated as a result of performing error correction encoding, which is then transmitted through a channel. The channel may refer to, for example, a wired or wireless medium through which information is transferred or a storage medium in which information is stored. For example, when the error correction circuit 10 is applied to a memory system, the channel may refer to either an interface which transmits and receives data between the error correction circuit 10 and a memory device, or the memory device itself. Codewords may be stored in a plurality of memory cells (e.g., memory cells constituting a single page) included in the memory device.

In some embodiments, the error correction encoder 100 may use a low-density parity check (LDPC) code as the error correction code, but embodiments of the present disclosure are not limited thereto.

In some embodiments, the error correction decoder 200 may perform error correction decoding using various algorithms which implement an iterative decoding scheme. For example, the error correction decoder 200 may perform error correction decoding using a message passing algorithm (MPA) that is also referred to as a "belief propagation algorithm (BPA)." For example, the error correction decoder 200 may perform error correction decoding using a sum-product algorithm, a min-sum algorithm or a bit flipping algorithm. Hereinafter, in the description of embodiments of the present disclosure, it is assumed that the error correction decoder 200 uses a bit flipping algorithm, which is one of message passing algorithms.

In some embodiments, the error correction decoder 200 may perform error correction decoding by performing iterations without exceeding a maximum number of iterations I specified in the bit flipping algorithm. When a valid codeword that satisfies constraints for the parity check matrix of the error correction code (ECC) is generated within the maximum number of iterations I, the error correction decoder 200 may output the generated valid codeword as a decoded codeword. When a valid codeword that satisfies the constraints for the parity check matrix of the error correction code is not generated within the maximum number of iterations I, the error correction decoder 200 may output a fail signal indicating that error correction decoding has failed.

In some embodiments, the error correction decoder 200 may use a low-density parity check (LDPC) code as the error correction code, but embodiments of the present disclosure are not limited thereto.

In some embodiments, the error correction decoder 200 may include a mapper 210, a node processor 220, a syndrome checker 230, and a decoding controller 240.

The mapper 210 may receive read values from the channel. The read values may correspond to a single codeword. For example, as a result of a read operation performed on a single page in which a codeword is stored, read values corresponding to a single codeword may be received; the read values may be '0' or '1'.

The mapper 210 may store the read values received from the channel in a first buffer 212, and may provide the read values stored in the first buffer 212 to the node processor 220. Hereinafter, the read values stored in the first buffer 212 are referred to as "channel values".

The mapper 210 may provide channel values, stored in the first buffer 212, to the node processor 220 at each initialization step and in each iteration. The channel values may be '0' or '1'.

The node processor 220 may perform error correction decoding within the maximum number of iterations I specified in a bit flipping algorithm based on the channel values received from the mapper 210. As described above, the bit flipping algorithm is one of message passing algorithms.

Such a message passing algorithm enables the generation of a result which converges on a codeword via exchange of messages performed between variable nodes and check nodes. The messages may include variable-node-to-check-node (V2C) messages that are sent from the variable nodes to the check nodes and check-node-to-variable-node (C2V) messages that are sent from the check nodes to the variable nodes. A process that includes passing V2C messages from the variable nodes to the check nodes, passing C2V messages from the check nodes to the variable nodes, and updating the values of respective nodes depending on the message passing may be referred to as a "single iteration". When the bit flipping algorithm is used as a message passing algorithm, each of the messages may indicate a value of '1' or '0'.

In some embodiments, the node processor 220 may include a variable node update module 222 and a check node update module 224.

The variable node update module 222 may initialize variable nodes using channel values received from the mapper 210 at an initialization step (e.g., before a first iteration is performed). That is, at the initialization step, the variable node update module 222 may assign the channel values to respective variable nodes one by one.

The variable node update module 222 may generate V2C messages that are sent to the check node update module 224 in a first iteration so that the channel values assigned to respective variable nodes are transferred to check nodes coupled to the corresponding variable nodes.

The variable node update module 222 may generate V2C messages based on the C2V messages, received from the check node update module 224, and send the generated V2C messages to the check node update module 224 in iterations other than the first iteration.

The variable node update module 222 may update respective hard decision values of the variable nodes in response to the C2V messages received from the check node update module 224 in a particular iteration.

The check node update module 224 may update the values of the check nodes in response to the V2C messages received from the variable node update module 222 in a particular iteration.

The check node update module 224 may generate C2V messages based on the V2C messages, received from the variable node update module 222, and send the generated C2V messages to the variable node update module 222 in a particular iteration.

Each of the C2V messages may indicate whether a check node corresponding thereto has satisfied constraints for a parity check matrix. For example, the C2V messages may have values of '0' or '1', wherein a value of '0' indicates that the check node corresponding to the C2V message has satisfied the constraints for the parity check matrix, and a value of '1' indicates that the check node corresponding to the C2V message has not satisfied the constraints for the parity check matrix. A check node that has sent a C2V message with a value of '1' is referred to as an "Unsatisfied Check Node (UCN)", and a check node that has sent a C2V message with a value of '0' is referred to as a "Satisfied Check Node (SCN)".

The node processor 220 may perform iterations within the maximum number of iterations I, and may provide the hard decision values of variable nodes, corresponding to an i-th iteration (hereinafter referred to as a "hard decision vector $C_i$"), to the syndrome checker 230. In an example, I is a natural number and i is a natural number less than or equal to I. The hard decision vector may be a row vector or a column vector. Hereinafter, the hard decision vector is assumed to be a row vector.

When a valid codeword that satisfies the constraints for the parity check matrix of the error correction code is generated within the maximum number of iterations I, the syndrome checker 230 may output the generated valid codeword as a decoded codeword. For example, the syndrome checker 230 may store the hard decision vector $C_i$, received from the node processor 220 in accordance with an i-th iteration, in a second buffer 232, and may perform a syndrome check on the received hard decision vector $C_i$. For example, the syndrome check may be performed by checking whether all symbols of a syndrome vector $S_i$ calculated using the following Equation (1) are '0'.

$$S_i = H \cdot C_i^T \qquad (1)$$

Here, $S_i$ denotes a syndrome vector corresponding to the i-th iteration, H denotes the parity check matrix of the error correction code, and $C_i^T$ denotes a transpose of the hard decision vector $C_i$ corresponding to the i-th iteration.

A case where all symbols of the syndrome vector $S_i$ are '0' indicates that the syndrome check has passed. This means that error correction decoding has been successfully performed in the i-th iteration, and thus the syndrome checker 230 may output the hard decision vector $C_i$, stored in the second buffer 232, as a decoded codeword.

On the other hand, a case where any of the symbols of the syndrome vector $S_i$ are '1' indicates that the syndrome check has failed. This means that error correction decoding has failed in the i-th iteration. Thus, when the current iteration falls within the maximum number of iterations I, the node processor 220 may perform the next iteration (e.g., an (i+1)-th iteration).

A check node corresponding to a '1' in the symbols of the syndrome vector $S_i$ is referred to as an "Unsatisfied Check Node (UCN)", and a check node corresponding to a '0' in the symbols of the syndrome vector $S_i$ is referred to as a "Satisfied Check Node (SCN)".

The decoding controller 240 may control at least one of the mapper 210 or the node processor 220 so that error correction decoding can be performed. For example, when a notification that the syndrome check corresponding to the i-th iteration has failed is received from the syndrome checker 230, the decoding controller 240 may control the mapper 210 so that the channel values stored in the first buffer 212 are provided to the node processor 220, and may control the node processor 220 so that the (i+1)-th iteration is performed.

In some embodiments, the error correction circuit 10 may further include a post processor configured to support the error correction decoder 200 so that the error correction decoder 200 can generate a valid codeword. The post processor may support the error correction decoder 200 so that various types of parameters used for error correction decoding are modified and error correction decoding is performed using the modified parameters.

Figures 2, 3:
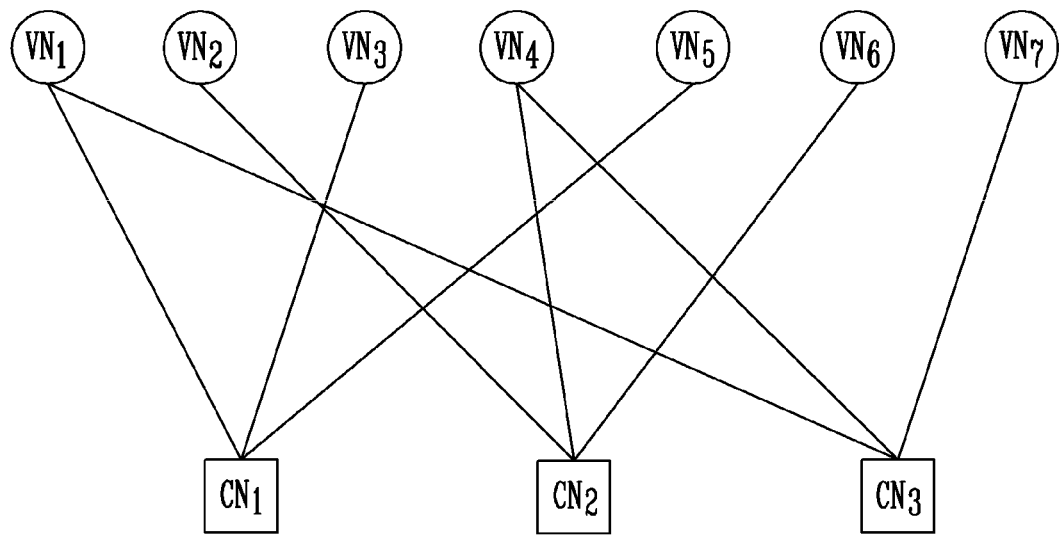
FIG. 2 is an example diagram illustrating a parity check matrix.
FIG. 3 is a diagram illustrating the parity check matrix of FIG. 2 as a Tanner graph.

FIG. 2 illustrates an example of a parity check matrix, which describes the linear relationships that the components of a codeword must satisfy. It can be used to decide whether a particular vector is a codeword and is also used in decoding algorithms.

An (n, k) code may be defined using a parity check matrix having a size of (n−k)×n. Here, k denotes the length of an original message and n−k denotes the number of parity bits. Each of entries of the parity check matrix may be a zero entry or a non-zero entry. When the number of non-zero entries included in the parity check matrix is much less than the number of zero entries, the (n, k) code may be referred to as a "(n, k) LDPC code." Here, n and k may be natural numbers. FIG. 2, as an example, illustrates the parity check matrix H of a (7, 4) code.

A matrix in which each entry is implemented as a sub-matrix may be referred to as a "base matrix". Each entry of the base matrix may be a sub-matrix having a z×z size. Here, z may be an integer greater than or equal to 2. For example, in the base matrix of a binary LDPC code, '0' may indicate that the corresponding entry is a zero matrix (of size z×z), and '1' may indicate that the corresponding entry is not a zero matrix. For example, in the base matrix of a binary Quasi Cyclic (QC)-LDPC code, '1' may indicate that the corresponding entry is a circulant matrix. The circulant matrix is a matrix obtained by cyclically shifting an identity matrix by a predetermined shift value. In an example, any one circulant matrix may have a shift value different from that of another circulant matrix in the base matrix.

FIG. 3 illustrates a Tanner graph that corresponds to the parity check matrix of FIG. 2.

An (n, k) code may be represented by a Tanner graph which is an expression of an equivalent bipartite graph, and is represented by n−k check nodes, n variable nodes, and edges. The check nodes correspond to the rows of the parity check matrix, and the variable nodes correspond to the columns of the parity check matrix. Each edge connects one check node to one variable node and indicates a non-zero (e.g., '1') entry in the parity check matrix.

The parity check matrix of the (7, 4) code illustrated in FIG. 2 may be represented by the Tanner graph illustrated in FIG. 3, which includes three check nodes $CN_1$ to $CN_3$ and seven variable nodes $VN_1$ to $VN_7$. Solid lines connecting the check nodes $CN_1$ to $CN_3$ to the variable nodes $VN_1$ to $VN_7$ indicate edges.

Iterative decoding may be performed, based on a message passing algorithm on the Tanner graph, through the exchange of messages between the check nodes $CN_1$ to $CN_3$ and the variable nodes $VN_1$ to $VN_7$. For example, iterative decoding may be performed by transferring messages between the check nodes $CN_1$ to $CN_3$ and the variable nodes $VN_1$ to $VN_7$ in each iteration.

The variable nodes may perform error correction using C2V messages received from check nodes coupled thereto. The variable nodes may generate V2C messages to be sent to check nodes coupled thereto, and may send the generated V2C messages to the corresponding check nodes, respectively.

The check nodes may perform a parity check using V2C messages received from variable nodes coupled thereto. The check nodes may generate C2V messages to be sent to variable nodes coupled thereto, and may send the generated C2V messages to the corresponding variable nodes, respectively.

Figures 4, 5:
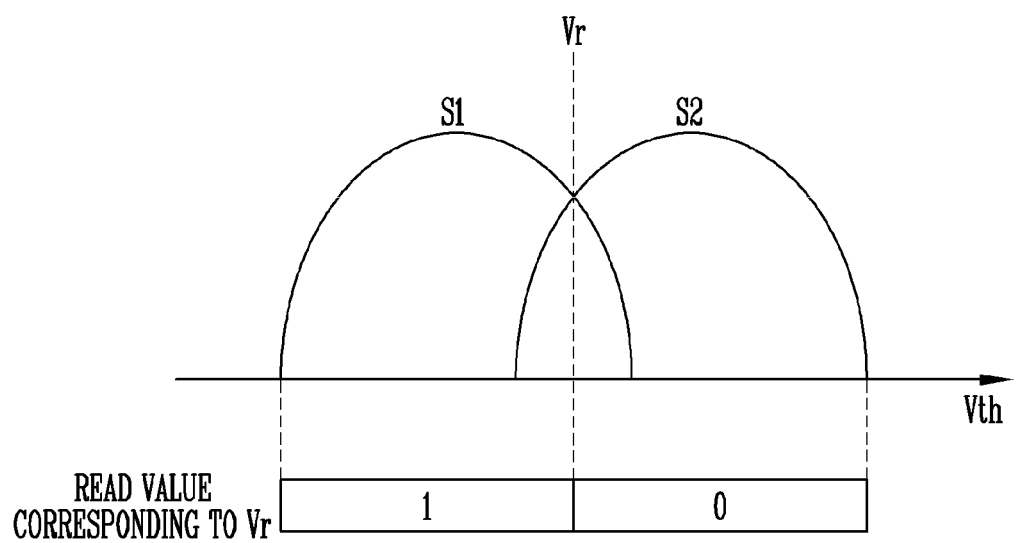
FIG. 4 is an example diagram illustrating the calculation of a syndrome vector using the parity check matrix of FIG. 2.
FIG. 5 is a diagram illustrating an example of a read value.

FIG. 4 is an example diagram illustrating the calculation of a syndrome vector using the parity check matrix of FIG. 2.

As illustrated therein, a syndrome vector $S_i$ may be generated as a product of a parity check matrix H and a transposed vector $C_i^T$ of a hard decision vector $C_i$ corresponding to an i-th iteration. Each of symbols $C_{i1}$, $C_{i2}$, $C_{i3}$, ..., $C_{i7}$ included in the hard decision vector $C_i$ denotes a hard decision value of a variable node corresponding to the i-th iteration. Symbols $S_{i1}$, $S_{i2}$, and $S_{i3}$ of the syndrome vector $S_i$ correspond check nodes $CN_1$, $CN_2$, and $CN_3$ in the Tanner graph of FIG. 3, respectively.

All symbols $S_{i1}$, $S_{i2}$, and $S_{i3}$ of the syndrome vector $S_i$ being '0' indicates that the syndrome check has passed. This means that, in the corresponding iteration, error correction decoding has been successfully performed. Therefore, iterative decoding of the corresponding codeword may be terminated, and the hard decision vector $C_i$ corresponding to the i-th iteration may be output as a decoded codeword.

On the contrary, when at least one of the symbols $S_{i1}$, $S_{i2}$, or $S_{i3}$ of the syndrome vector $S_i$ is '1' indicates that the syndrome check has failed. This means that, in the corresponding iteration, error correction decoding has not succeeded. Thus, if the current iteration has not exceeded the maximum number of iterations I, a next iteration may be performed.

FIG. 5 is a diagram illustrating an example of a read value.

As illustrated in FIG. 5, threshold voltage distributions Vth of memory cells have a first state S1 and a second state S2.

In order to acquire read values corresponding to a single codeword, a single read voltage Vr may be applied to a plurality of memory cells (e.g., memory cells constituting a single page) which store a single codeword. Accordingly, a single read value per memory cell may be acquired.

For example, when the read voltage Vr is applied to a plurality of memory cells, a read value for a memory cell having a threshold voltage lower than the read voltage Vr may appear as '1', and a read value for a memory cell having a threshold voltage higher than the read voltage Vr may appear as '0'.

Figure 6:
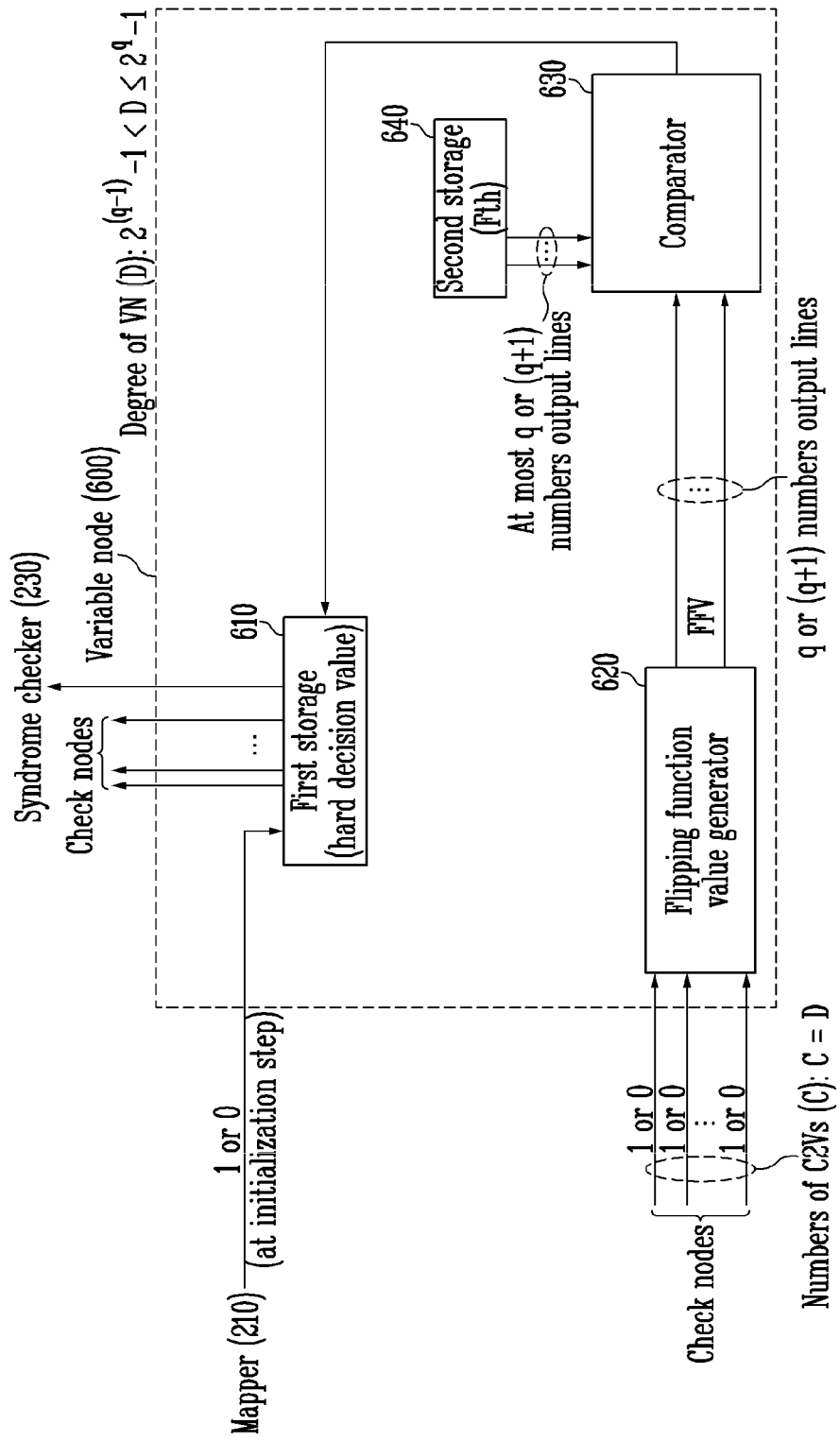
FIG. 6 is a diagram illustrating an example of a variable node according to an embodiment of the present disclosure.

FIG. 6 is a diagram illustrating an example of a variable node according to an embodiment of the present disclosure.

In an example, the variable node 600 in FIG. 6 may be one of the plurality of variable nodes of the variable node update module 222 illustrated in FIG. 1. In some embodiments, all variable nodes in the variable node update module 222 in FIG. 1 may have the same configuration, and perform the same operation, as the variable node 600 of FIG. 6.

As illustrated in FIG. 6, the variable node 600 may include a first storage (or memory) 610, a flipping function value generator 620, a comparator 630, and a second storage 640.

The first storage 610 may store a channel value received from a mapper 210 at an initialization step as a hard decision value of the variable node 600. The first storage 610 may maintain the stored hard decision value without change, or may flip the stored hard decision value and store the flipped hard decision value, depending on a signal received from the comparator 630 in each iteration. In each iteration, the hard decision value stored in the first storage 610 may be provided to at least one of the syndrome checker 230 or check nodes coupled to the variable node 600.

The flipping function value generator 620 may generate a flipping function value (FFV) and provide the generated flipping function value to the comparator 630 in each iteration. For example, the flipping function value generator 620 may generate a flipping function value based on C2V messages received from the check nodes connected to the variable node 600.

The comparator 630 may determine whether to flip the hard decision value stored in the first storage 610 based on the flipping function value received from the flipping function value generator 620 and a flipping threshold value Fth received from the second storage 640, in each iteration. In an example, when the flipping function value is equal to or greater than the flipping threshold value Fth, the comparator 630 may determine to flip the hard decision value stored in the first storage 610. In this case, the comparator 630 may generate a signal instructing the hard decision value to be flipped and the generated signal to be output to the first storage 610. In another example, when the flipping function value is less than the flipping threshold value Fth, the comparator 630 may determine not to flip the hard decision value stored in the first storage 610. In this case, the comparator 630 may generate a signal instructing the hard decision value not to be flipped and the generated signal to be output to the first storage 610.

First Embodiment of the Disclosed Technology

In some embodiments, the degree D of the variable node 600 is assumed to satisfy $2^{(q-1)}-1 < D \leq 2^q - 1$. Here, q may be an integer greater than or equal to 2.

For example, the flipping function value generator 620 may generate the flipping function value by adding all values indicated by the C2V messages received from the check nodes coupled to the variable node 600. The number of C2V messages (denoted C) may be equal to the degree D of the variable node 600, and each of the C2V messages may have a value of '0' or '1'. In this example, the flipping function value is an integer value in the range [0, D]. Here, the flipping function value indicates the number of UCNs (#UCN) coupled to the variable node 600.

When the degree D of the variable node 600 satisfies $2^{(q-1)}-1 < D \leq 2^q - 1$, the flipping function value is an integer value in the range [0, $2^q - 1$], which requires q bits in order to represent the flipping function value. Therefore, in order for the flipping function value to be output from the flipping function value generator 620 to the comparator 630, q output lines are required.

The flipping threshold value Fth may be selected from the range of the flipping function value. Therefore, the flipping threshold value Fth may have an integer value within the range [0, $2^q - 1$], which requires at most q bits to represent the flipping threshold value Fth. Therefore, in order for the flipping threshold value Fth to be output from the second storage 640 to the comparator 630, at most q output lines are required.

In this embodiment, the comparator 630 may require q input ports for receiving the flipping function value and at most q input ports for receiving the flipping threshold value Fth.

Second Embodiment of the Disclosed Technology

In some embodiments, the degree D of the variable node 600 is assumed to satisfy $2^{(q-1)}-1<D\leq2^q-1$. Here, q may be an integer greater than or equal to 2.

The flipping function value generator 620 may generate, as the flipping function value (FFV), the difference between the number of UCNs (#UCN) coupled to the variable node 600 and the number of SCNs (#SCN) coupled to the variable node 600. In an example, the flipping function value generator 620 may generate the flipping function value using the following Equation (2):

$$FFV = \#UCN - \#SCN \quad (2)$$

For example, the flipping function value generator 620 may generate the flipping function value by converting all values of '0', among values indicated by C2V messages, into '−1', and then adding the values indicated by the C2V messages. When the number of UCNs (#UCN) is D, the number of SCNs (#SCN) may be 0, whereas, when the number of UCNs (#UCN) is 0, the number of SCNs (#SCN) is D, and thus the flipping function value is an integer within the range [−D, D].

When the degree D of the variable node 600 satisfies $2^{(q-1)}-1<D\leq2^q-1$, the flipping function value is an integer within the range $[-(2^q-1), 2^q-1]$, which requires q+1 bits in order to represent the flipping function value. Therefore, in order for the flipping function value FFV to be output from the flipping function value generator 620 to the comparator 630, q+1 output lines may be required.

The flipping threshold value Fth may be selected from the range of the flipping function value. Therefore, the flipping threshold value Fth may be an integer within the range $[-(2^q-1), 2^q-1]$. This means that at most q+1 bits are required in order to represent the flipping threshold value Fth. Therefore, in order for the flipping threshold value Fth to be output from the second storage 640 to the comparator 630, at most q+1 output lines may be required.

In this embodiment, the comparator 630 may require q+1 input ports for receiving the flipping function value and at most q+1 input ports for receiving the flipping threshold value Fth.

Figure 7:
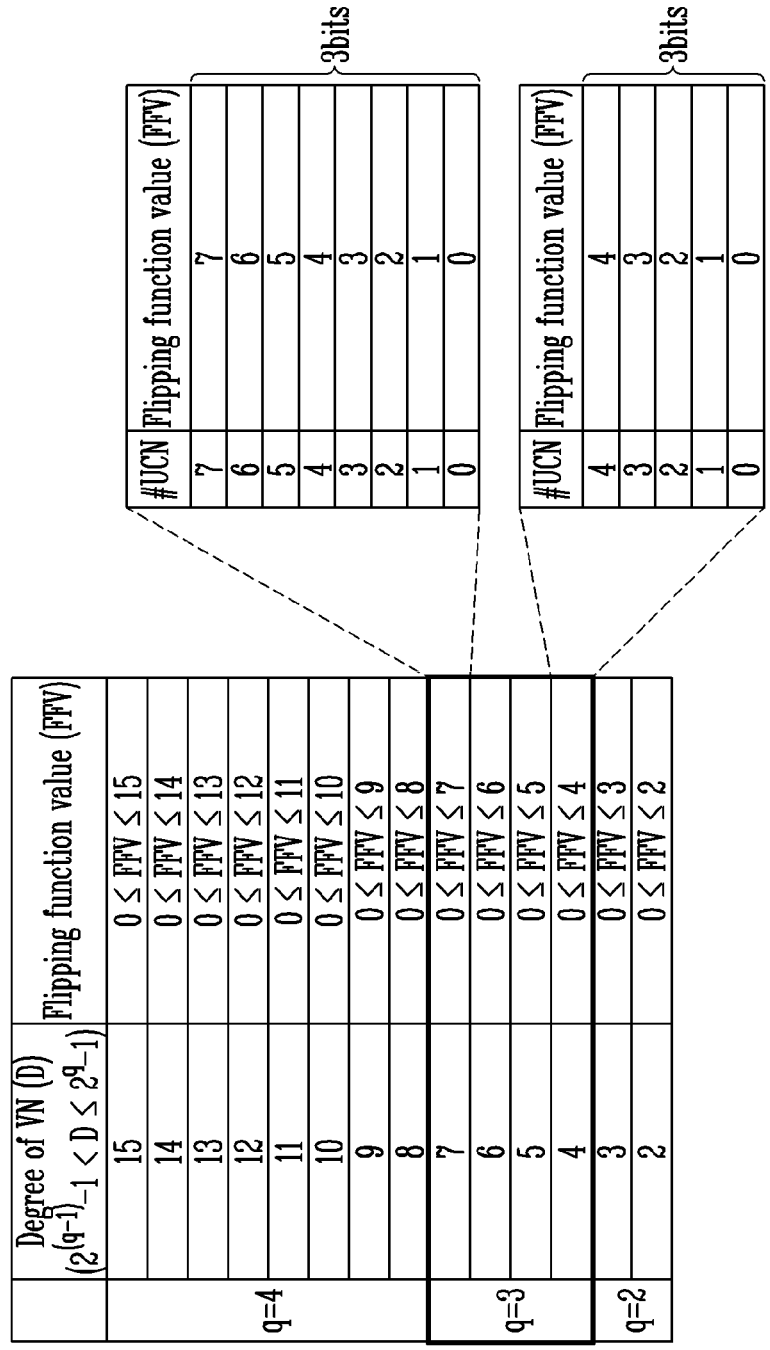
FIG. 7 is a diagram illustrating the operation of an example flipping function value according to an embodiment of the present disclosure.

FIG. 7 is a diagram illustrating the operation of an example flipping function value according to some embodiments of the present disclosure.

In some embodiments, when the degree of the variable node 600 is D, a flipping function value is an integer within the range [0, D]. For example, when the degree D of the variable node 600 is 7, the flipping function value is an integer within the range [0, 7]. For another example, when the degree D of the variable node 600 is 4, the flipping function value is an integer values within the range [0, 4].

Figure 8:
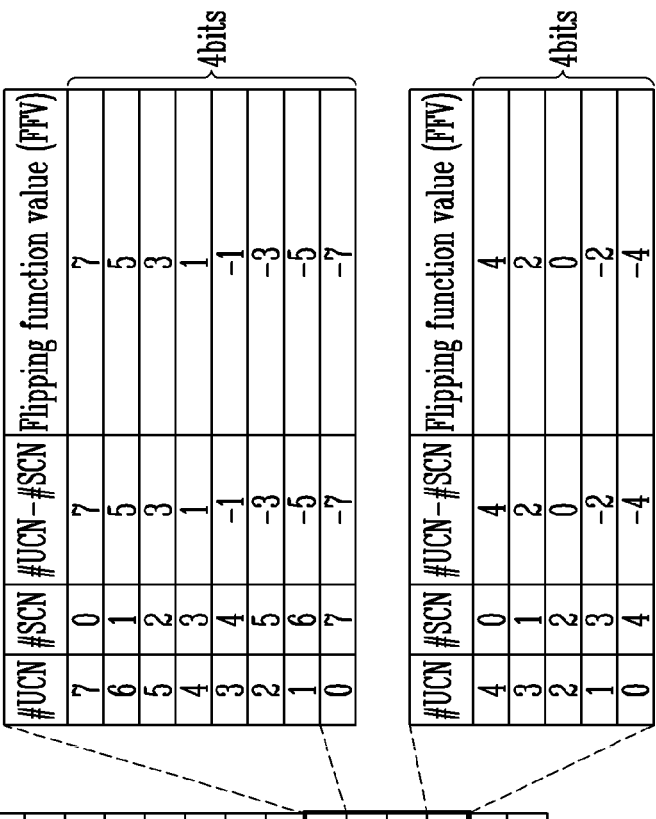
FIG. 8 is a diagram illustrating the operation of another example flipping function value according to an embodiment of the present disclosure.

When the degree D of the variable node 600 satisfies $2^{(q-1)}-1<D\leq2^q-1$, the flipping function value FFV is an integer within the range $[0, 2^q-1]$. This means that q bits are required in order to represent the flipping function value FFV. For example, when q is 3, the flipping function value is an integer within the range [0, 7]. Therefore, when q is 3, 3 bits may be required in order to represent the flipping function value FFV FIG. 8 is a diagram illustrating the operation of another example flipping function value according to an embodiment of the present disclosure.

In this embodiment, when the degree of the variable node 600 is D, the flipping function value FFV is an integer within the range [−D, D]. For an example, when the degree D of the variable node 600 is 7, the flipping function value is an integer within the range [−7, 7]. For another example, when the degree D of the variable node 600 is 4, the flipping function value is an integer within the range [−4, 4].

When the degree D of the variable node 600 satisfies $2^{(q-1)}-1<D\leq2^q-1$, the flipping function value FFV is an integer within the range $[-(2^q-1), 2^q-1]$, which requires q+1 bits in order to represent the flipping function value. For example, when q is 3, the flipping function value is an integer within the range [−7, 7]. Therefore, when q is 3, 4 bits may be required in order to represent the flipping function value.

Figure 9:
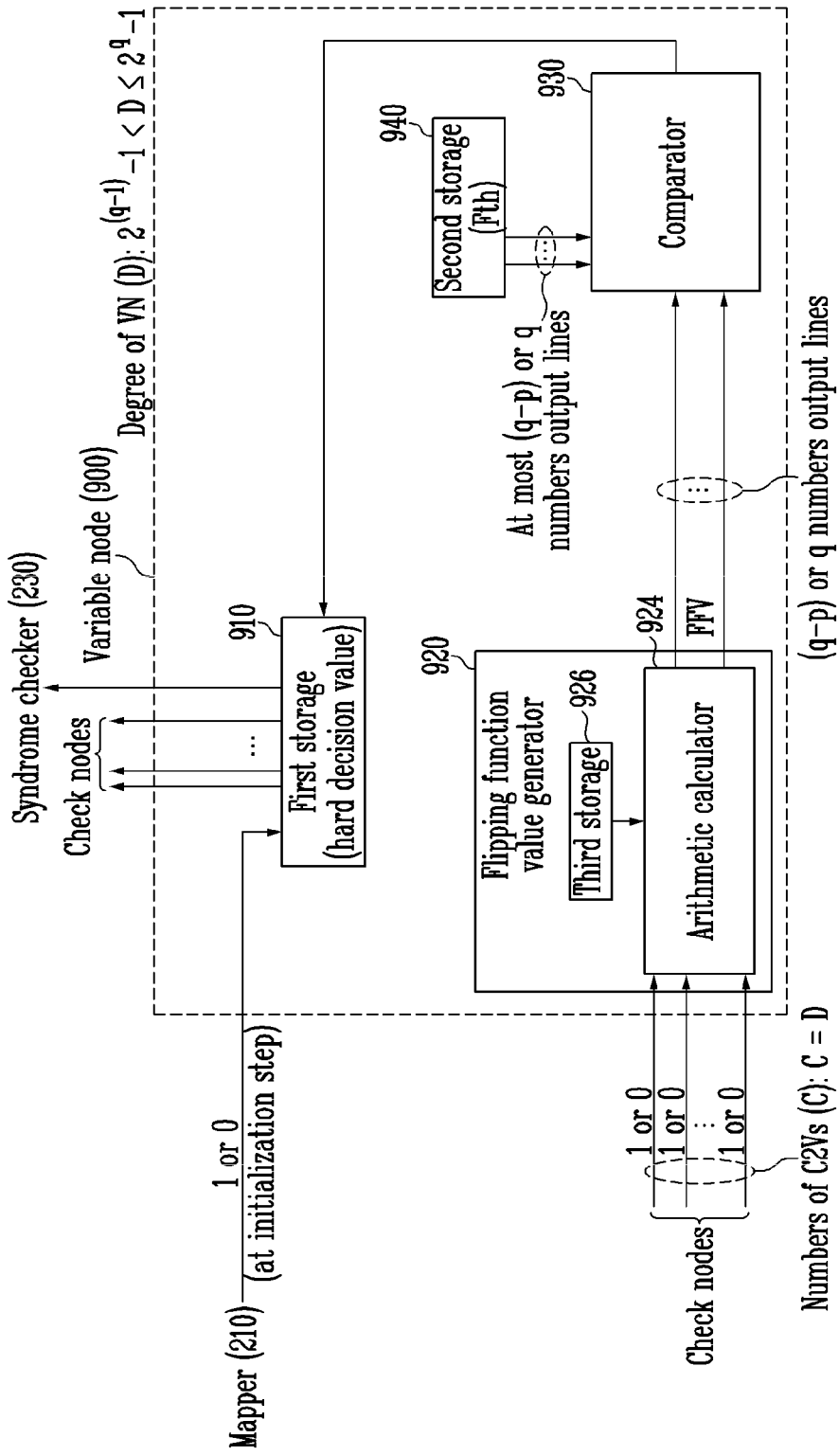
FIG. 9 is a diagram illustrating another example of a variable node according to an embodiment of the present disclosure.

FIG. 9 is a diagram illustrating another example of a variable node according to an embodiment of the present disclosure.

In an example, the variable node 900 in FIG. 9 may be one of the plurality of variable nodes of the variable node update module 222 illustrated in FIG. 1. In some embodiments, all variable nodes included in the variable node update module 222 in FIG. 1 may have the same configuration, and perform the same operation, as the variable node 900 of FIG. 9.

As illustrated in FIG. 9, the variable node 900 may include a first storage (or memory) 910, a flipping function value generator 920, a comparator 930, and a second storage 940.

The first storage 910 may store a channel value, received from a mapper 210 at an initialization step, as a hard decision value of the variable node 900.

The first storage 910 may update the stored hard decision value in response to a signal received from the comparator 930 in each iteration. In an example, updating the hard decision value may include the stored hard decision value being maintained without change, or the stored hard decision value being flipped and stored. Flipping of the hard decision value may mean that a value of '0' is changed to '1' or that a value of '1' is changed to '0'. For an example, when a signal instructing the hard decision value to be flipped is received from the comparator 930, the first storage 910 may flip and store the stored hard decision value. For another example, when a signal instructing the hard decision value not to be flipped is received from the comparator 930, the first storage 910 may maintain the stored hard decision value without change. The updated hard decision value may be provided to a syndrome checker 230 so as to perform a syndrome check.

The variable node 900 may generate V2C messages and send the generated V2C messages to check nodes coupled to the variable node 900 in each iteration. This may mean that, in each iteration, the hard decision value stored in the first storage 910 is transmitted to the check nodes coupled to the variable node 900. For example, when a value of '1' is stored, as the hard decision value of the variable node 900, in the first storage 910, a value of '1' may be transmitted to all check nodes coupled to the variable node 900. For example, when a value of '0' is stored, as the hard decision value of the variable node 900, in the first storage 910, a value of '0' may be transmitted to all check nodes coupled to the variable node 900.

The first storage (or memory) 910 may be implemented as a volatile memory. For example, the first storage 910 may be implemented as a Static Random Access Memory (SRAM) or a Dynamic Random Access Memory (DRAM), but embodiments of the present disclosure are not limited thereto.

The flipping function value generator 920 may generate a flipping function value and provide the generated flipping function value FFV to the comparator 930 in each iteration. In some embodiments, the flipping function value generator 920 may include an arithmetic calculator 924 and a third storage 926. The arithmetic calculator 924 may be implemented as a combinational logic circuit, but embodiments of the present disclosure are not limited thereto.

In another embodiment which will be described later, the flipping function value generator 920 may generate a flipping function value FFV based on C2V messages received from the check nodes coupled to the variable node 900 and an offset value stored in the third storage 926.

In yet another embodiment which will be described later, the flipping function value generator 920 may generate a flipping function value based on C2V messages received from the check nodes coupled to the variable node 900 and a reference value stored in the third storage 926.

The comparator 930 may determine whether to flip the hard decision value stored in the first storage 910 based on the flipping function value, received from the flipping function value generator 920, and a flipping threshold value Fth in each iteration. For an example, when the flipping function value is equal to or greater than the flipping threshold value Fth, the comparator 930 may determine to flip the hard decision value stored in the first storage 910. In this case, the comparator 930 may generate a signal instructing the hard decision value to be flipped and the generated signal to be output to the first storage 910. For another example, when the flipping function value FFV is less than the flipping threshold value Fth, the comparator 930 may determine not to flip the hard decision value stored in the first storage 910. In this case, the comparator 930 may generate a signal instructing the hard decision value not to be flipped and the generated signal to be output to the first storage 910.

In some embodiments, when the flipping function value indicates a set value (e.g., a value of '0' or a reference value), the comparator 930 may skip a comparison with the flipping threshold value Fth. Therefore, compared to the first and second embodiments (e.g., comparator 630), the computational load and power consumption of the comparator 930 may be reduced. In this case, the comparator 930 may generate a signal instructing the hard decision value not to be flipped and the generated signal to be output to the first storage 910. The set value may be stored as a fixed value in the comparator 930.

The second storage 940 may store the flipping threshold value Fth. The second storage 940 may provide the flipping threshold value Fth to the comparator 930 in each iteration. The second storage 940 may be implemented as a register, but embodiments of the present disclosure are not limited thereto.

Third Embodiment of the Disclosed Technology

In some embodiments, the arithmetic calculator 924 may generate a first value by adding all values indicated by C2V messages received from check nodes coupled to the variable node 900. The number of C2V messages that are received may be equal to the degree D of the variable node 900, and each of the C2V messages may have a value of '0' or '1'. Therefore, the first value is an integer within the range [0, D]. Here, the first value may indicate the number of UCNs (#UCN) coupled to the variable node 900.

The arithmetic calculator 924 may generate a flipping function value by applying an offset value to the number of UCNs (#UCN) coupled to the variable node 900. For example, the arithmetic calculator 924 may generate the flipping function value FFV using the following Equation (3):

FFV=#UCN−offset value(where, #UCN≥offset value)

FFV=0 (where, #UCN<offset value)     (3)

Equation (3) shows that, when the number of UCNs (#UCN) is equal to or greater than the offset value, a value, obtained by subtracting the offset value from the number of UCNs (#UCN), is set as the flipping function value FFV, and when the number of UCNs (#UCN) is less than the offset value, a value of '0' is set as the flipping function value FFV.

The offset value may be a value preset (or predetermined) according to the degree D of the variable node 900.

In an embodiment, when the degree D of the variable node 900 satisfies $2^{(q-1)}-1 < D \leq 2^q-1$, the offset value may be preset such that the flipping function value FFV is represented by fewer than q bits. For example, the offset value may be preset such that, among values which the flipping function value FFV can have, the largest value is less than or equal to $2^{(q-p)}-1$. This means that the flipping function value is an integer within the range $[0, 2^{(q-p)}-1]$. This also means that the offset value may be preset such that the flipping function value FFV is represented by (q−p) bits.

In an example, q may be an integer greater than or equal to 2, and the value of q applied to at least one of a plurality of variable nodes included in the variable node update module 222 may be different from the value of q applied to the remaining variable nodes. This is similar to framework in the fourth, seventh, and eighth embodiments.

In an example, p may be a natural number less than the preset q. For example, the offset value may be preset such that, when p is 1, the flipping function value FFV is represented by q−1 bits, and may be preset such that, when p is 2, the flipping function value FFV is represented by q−2 bits. For example, the offset value may be set to any one of natural numbers less than D satisfying the following Equation (4):

$$D - \text{offsetvalue} < 2^{(q-p)} \quad (4)$$

When the flipping function value FFV is an integer within the range $[0, 2^{(q-p)}-1]$, (q−p) bits may be required in order to represent the flipping function value FFV. Therefore, in order for the flipping function value FFV to be output from the flipping function value generator 920 to the comparator 930, (q−p) output lines may be required.

In comparison to the previously described first embodiment, the number of output lines for outputting the flipping function value FFV may be decreased by p.

The flipping threshold value Fth may be selected from the range which the flipping function value FFV can have. Therefore, the flipping threshold value Fth may be an integer within the range $[0, 2^{(q-p)}-1]$, which requires at most (q−p) bits in order to represent the flipping threshold value Fth. Therefore, in order for the flipping threshold value Fth to be output from the second storage 940 to the comparator 930, at most (q−p) output lines may be required.

In this embodiment, the number of output lines for outputting the flipping threshold value Fth is decreased by at least p in comparison with the previously described first embodiment.

In this embodiment, the comparator 930 may require q−p input ports for receiving the flipping function value FFV and at most q−p input ports for receiving the flipping threshold value Fth. Therefore, compared to the first embodiment (e.g., comparator 630), the size, hardware complexity, and computational load of the comparator 930 may be reduced.

Fourth Embodiment of the Disclosed Technology

In some embodiments, the arithmetic calculator 924 may generate, as a second value, the difference between the number of UCNs (#UCN) coupled to the variable node 900 and the number of SCNs (#SCN) coupled to the variable node 900. For example, the arithmetic calculator 924 may generate the second value using the following Equation (5):

$$\text{second value}=\#\text{UCN}-\#\text{SCN} \quad (5)$$

In other words, the arithmetic calculator 924 may generate the second value by changing all values of '0', among values indicated by the C2V messages, to '−1', and then adding the values indicated by the C2V messages. When the number of UCNs (#UCN) is D, the number of SCNs (#SCN) is 0, whereas when the number of UCNs (#UCN) is 0, the number of SCNs (#SCN) is D, and thus the second value is an integer within the range [−D, D].

The arithmetic calculator 924 may generate the flipping function value based on the second value and a reference value. For example, the arithmetic calculator 924 may generate the flipping function value FFV using the following Equation (6):

$$\text{FFV}=\text{second value (where, second value} \geq \text{reference value)}$$

$$\text{FFV}=\text{reference value (where, second value} < \text{reference value)} \quad (6)$$

Equation (6) shows that, when the second value is equal to or greater than the reference value, the second value is set as the flipping function value FFV, whereas when the second value is less than the reference value, the reference value is set as the flipping function value FFV.

The reference value may be an integer within the range [−D, D], and may be, for example, '0'. The following example assumes that the reference value is '0'.

In some embodiments, when the degree D of the variable node 900 satisfies $2^{(q-1)}-1<D\leq 2^q-1$, the flipping function value is an integer within the range [0, $2^q-1$], which requires q bits in order to represent the flipping function value FFV Therefore, in order for the flipping function value FFV to be output from the flipping function value generator 920 to the comparator 930, q output lines may be required.

In this embodiment, the number of output lines for outputting the flipping function value FFV may be decreased by 1 in comparison with the second embodiment.

The flipping threshold value Fth may be selected from the range of the flipping function value FFV Therefore, the flipping threshold value Fth is an integer within the range [0, $2^q-1$], which requires at most q bits in order to represent the flipping threshold value Fth. Therefore, in order for the flipping threshold value Fth to be output from the second storage 940 to the comparator 930, at most q output lines may be required.

In this embodiment, the number of output lines for outputting the flipping threshold value Fth may be decreased by at least 1 in comparison with the second embodiment.

In this embodiment, the comparator 930 may require only q input ports for receiving the flipping function value FFV and at most q input ports for receiving the flipping threshold value Fth. Therefore, compared to the second embodiment, the size, hardware complexity, and computational load of the comparator 930 may be reduced.

FIG. 10 is a diagram illustrating the operation of an example flipping function value and an offset value according to an embodiment of the present disclosure.

In this embodiment, the offset value may be set according to the degree D of the variable node 900. For example, when the degree D of the variable node 900 satisfies $2^{(q-1)}-1<D\leq 2^q-1$, the offset value may be set to a larger value as the degree D of the variable node 900 is higher, whereas the offset value may be set to a smaller value as the degree D of the variable node 900 is lower. Referring to FIG. 10, it can be seen that, when q is 4, 3, or 2, the offset value is set to a larger value as the degree D of the variable node is higher.

When the degree of the variable node 900 satisfies $2^{(q-1)}-1<D\leq 2^q-1$, the offset value may be set such that the largest value, among values which the flipping function value FFV can have, is less than or equal to $2^{(q-p)}-1$. This means that the offset value may be set such that the flipping function value FFV is represented by (q−p) bits. Here, p may be a natural number less than q.

When the degree of the variable node 900 satisfies $2^{(q-1)}-1<D\leq 2^q-1$, the flipping function value FFV is an integer within the range [0, $2^{(q-p)}-1$]. This means that (q−p) bits are required in order to represent the flipping function value FFV For an example, when p is 1 and q is 3, the flipping function value FFV is an integer within the range [0, 3]. In this case, 2 bits may be required in order to represent the flipping function value FFV For another example, when p is 2 and q is 3, the flipping function value FFV is an integer within the range [0, 1]. In this case, 1 bit may be required in order to represent the flipping function value FFV.

In accordance with this embodiment, the number of bits required in order to represent the flipping function value FFV is decreased by p in comparison with the first embodiment, described above with reference to FIG. 7.

Figure 11:
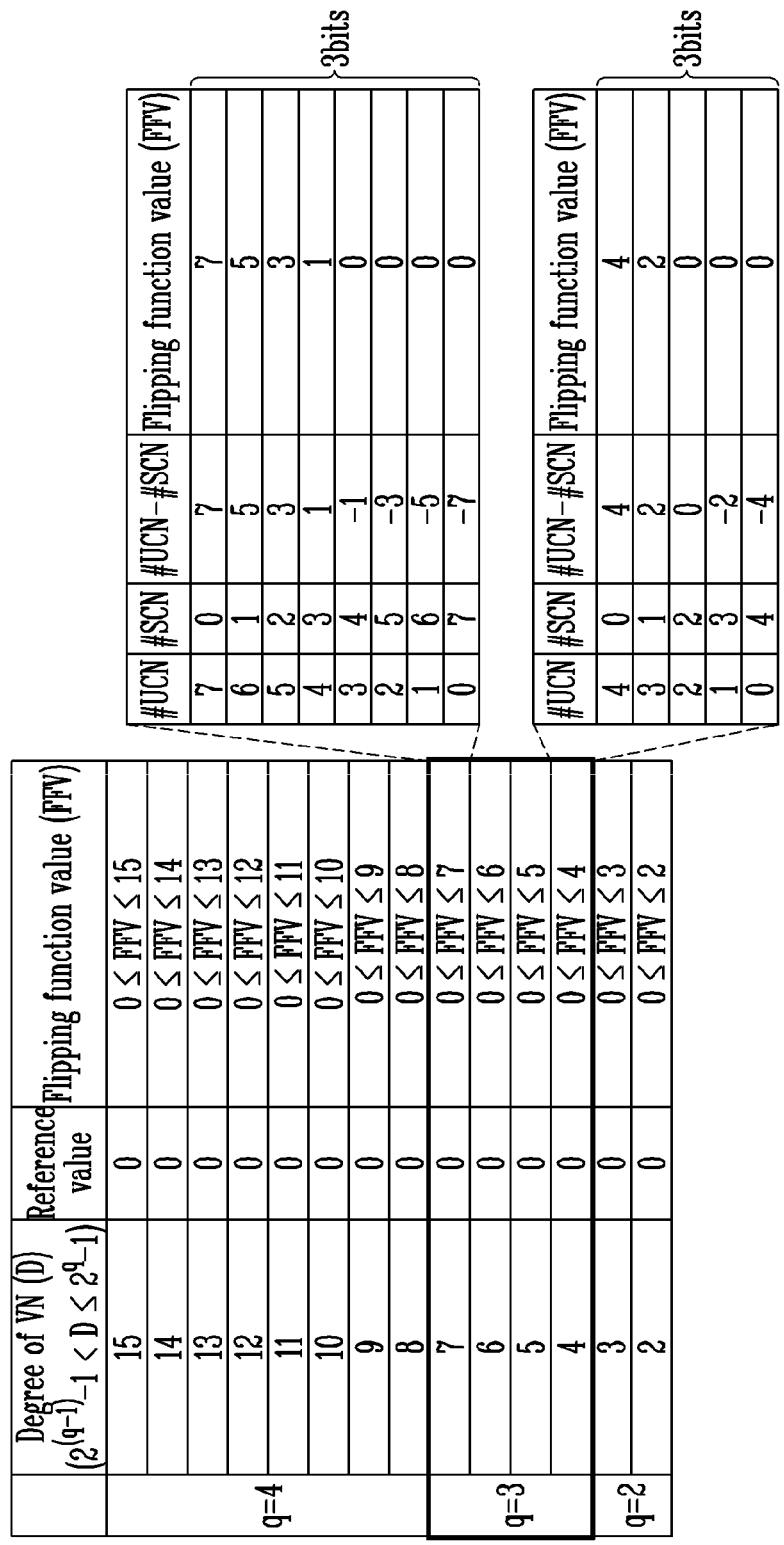
FIG. 11 is a diagram illustrating the operation of an example flipping function value and a reference value according to an embodiment of the present disclosure.

FIG. 11 is a diagram illustrating the operation of an example flipping function value and a reference value according to an embodiment of the present disclosure.

In this embodiment, the reference value may be selected from the range of [−D, D] when the degree of a variable node is D, and a case where the reference value is '0' is illustrated as an example in FIG. 11.

When the degree of the variable node 900 is D, a flipping function value FFV is an integer within the range [0, D]. For an example, when the degree D of the variable node 900 is 7, the flipping function value FFV is an integer within the range [0, 7]. For another example, when the degree D of the variable node 900 is 4, the flipping function value FFV is an integer within the range [0, 4].

When the degree D of the variable node 900 satisfies $2^{(q-1)}-1<D\leq 2^q-1$, the flipping function value FFV is an integer within the range [0, $2^{(q-1)}$], which requires q bits in order to represent the flipping function value FFV. For example, when q is 3, the flipping function value FFV is an integer within the range [0, 7]. Therefore, when q is 3, 3 bits may be required in order to represent the flipping function value FFV In accordance with this embodiment, the number of bits required in order to represent the flipping function value FFV may be decreased by 1 in comparison with the second embodiment, described above with reference to FIG. 8.

Figure 12:
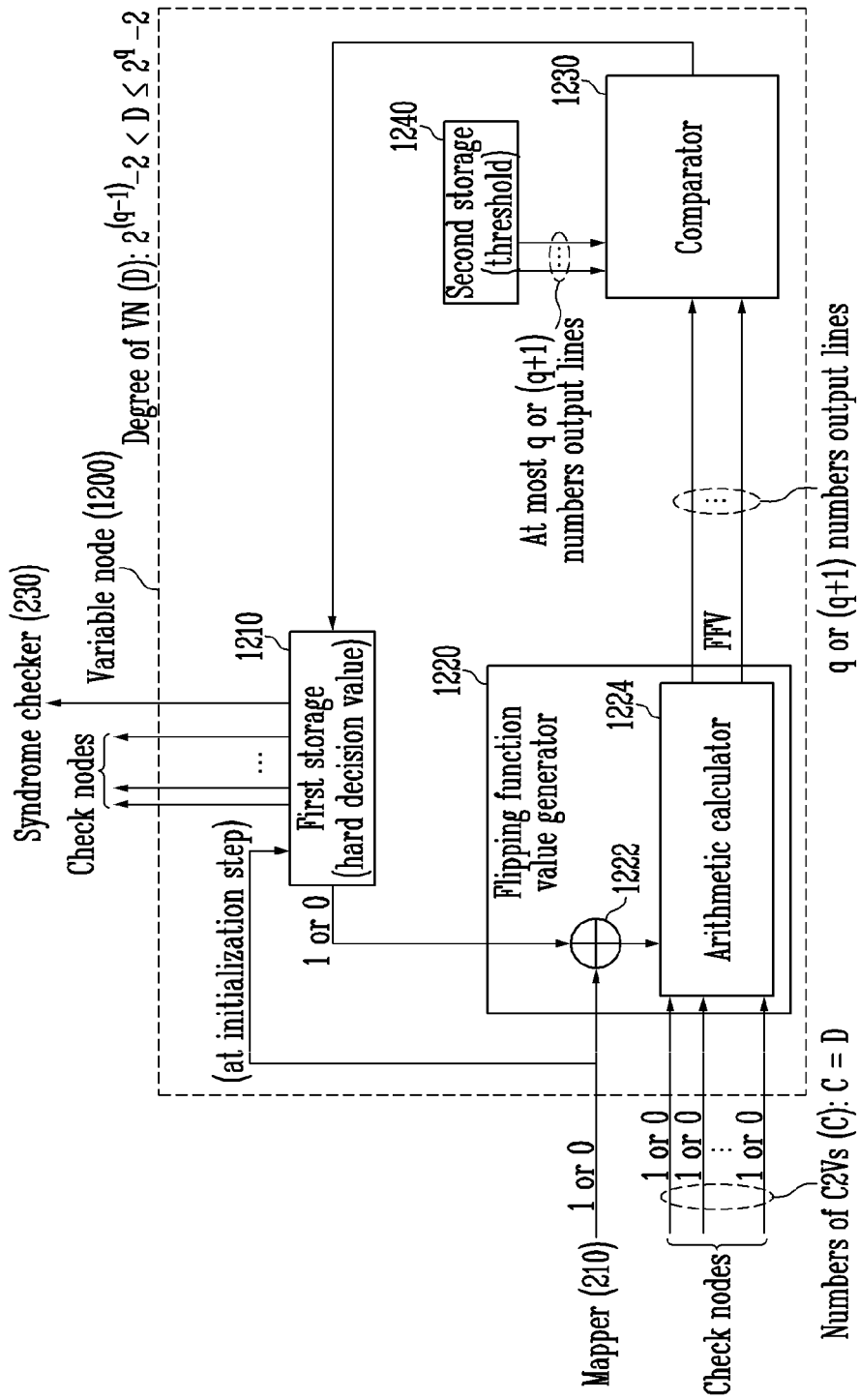
FIG. 12 is a diagram illustrating yet another example of a variable node according to an embodiment of the present disclosure.

FIG. 12 is a diagram illustrating another example of a variable node according to an embodiment of the present disclosure.

In an example, the variable node 1200 in FIG. 12 may be one of the plurality of variable nodes of the variable node update module 222 illustrated in FIG. 1. In some embodiments, all variable nodes in the variable node update module 222 in FIG. 1 may have the same configuration, and perform the same operation, as the variable node 1200 of FIG. 12.

As illustrated in FIG. 12, the variable node 1200 may include a first storage 1210, a flipping function value generator 1220, a comparator 1230, and a second storage 1240.

The first storage (or memory) 1210 may store a channel value, received from a mapper 210 at an initialization step, as a hard decision value of the variable node 1200. The first storage 1210 may maintain the stored hard decision value without change, or may flip the stored hard decision value and store the flipped hard decision value, depending on a signal received from the comparator 1230 in each iteration. In each iteration, the hard decision value stored in the first storage 1210 may be provided to at least one of the syndrome checker 230 or check nodes coupled to the variable node 1200.

The flipping function value generator 1220 may generate a flipping function value FFV and provide the generated flipping function value FFV to the comparator 1230 in each iteration. In some embodiments, the flipping function value generator 1220 may include a modulo calculator 1222 and an arithmetic calculator 1224.

The modulo calculator 1222 may perform a modulo-2 operation between the channel value received from the mapper 210 and the hard decision value received from the first storage 1210, and may provide the result of the modulo-2 operation to the arithmetic calculator 1224.

The arithmetic calculator 1224 may generate the flipping function value FFV based on C2V messages received from the check nodes coupled to the variable node 1200 and the result of the modulo-2 operation received from the modulo-2 calculator 1222.

The comparator 1230 may determine whether to flip the hard decision value stored in the first storage 1210 based on the flipping function value FFV received from the flipping function value generator 1220 and a flipping threshold value Fth received from the second storage 1240, in each iteration. For example, when the flipping function value FFV is equal to or greater than the flipping threshold value Fth, the comparator 1230 may determine to flip the hard decision value stored in the first storage 1210. In this case, the comparator 1230 may generate a signal instructing the hard decision value to be flipped and the generated signal to be output to the first storage 1210. For example, when the flipping function value FFV is less than the flipping threshold value Fth, the comparator 1230 may determine not to flip the hard decision value stored in the first storage 1210. In this case, the comparator 1230 may generate a signal instructing the hard decision value not to be flipped and the generated signal to be output to the first storage 1210.

Fifth Embodiment of the Disclosed Technology

In this embodiment, the degree D of the variable node 1200 is assumed to satisfy $2^{(q-1)}-2<D\leq 2^q-2$. In an example, q may be an integer greater than or equal to 2.

The arithmetic calculator 1224 may generate a flipping function value FFV by adding the result of the modulo-2 operation received from the modulo-2 calculator 1222 and all of values indicated by C2V messages received from the check nodes coupled to the variable node 1200, in each iteration. The number of C2V messages is equal to the degree D of the variable node 1200, and each of the values of the C2V messages and the result of the modulo-2 operation may indicate a value of '0' or '1'. Therefore, the flipping function value is an integer within the range $[0, D+1]$.

When the degree D of the variable node 1200 satisfies $2^{(q-1)}-2<D\leq 2^q-2$, the flipping function value is an integer within the range $[0, 2^q-1]$, which requires q bits in order to represent the flipping function value FFV Therefore, in order for the flipping function value FFV to be output from the flipping function value generator 1220 to the comparator 1230, q output lines may be required.

The flipping threshold value Fth may be selected from the range of the flipping function value. Therefore, the flipping threshold value is an integer within the range $[0, 2^q-1]$. This means that at most q bits are required in order to represent the flipping threshold value Fth. Therefore, in order for the flipping threshold value Fth to be output from the second storage 1240 to the comparator 1230, at most q output lines may be required.

In this embodiment, the comparator 1230 may require q input ports for receiving the flipping function value FFV and at most q input ports for receiving a flipping threshold value Fth.

Sixth Embodiment of the Disclosed Technology

In this embodiment, the degree D of the variable node 1200 is assumed to satisfy $2^{(q-1)}-2<D\leq 2^q-2$. In an example, q may be an integer greater than or equal to 2.

The arithmetic calculator 1224 may generate, as a third value, the difference between the number of UCNs (#UCN) coupled to the variable node 1200 and the number of SCNs (#SCN) coupled to the variable node 1200. For example, the arithmetic calculator 1224 may generate the third value using the following Equation (7):

$$\text{third value}=\#UCN-\#SCN \quad (7)$$

In other words, the arithmetic calculator 1224 may generate the third value by changing all values of '0', among values indicated by the C2V messages, to '−1', and then adding the values indicated by the C2V messages. When the number of UCNs (#UCN) is D, the number of SCNs (#SCN) is 0, whereas when the number of UCNs (#UCN) is 0, the number of SCNs (#SCN) is D, and thus the third value may be an integer within the range $[-D, D]$.

The arithmetic calculator 1224 may generate the flipping function value FFV by applying the result of the modulo-2 operation MOD2result received from the modulo calculator 1222 to the third value. For example, the arithmetic calculator 1224 may generate the flipping function value FFV using the following Equation (8):

$$\text{FFV}=\text{third value}+\text{MOD2result (where, MOD2result=1)}$$

$$\text{FFV}=\text{third value}-1 \text{ (where, MOD2result=0)} \quad (8)$$

Equation (8) shows that, when the result of the modulo-2 operation is '1', a value obtained by adding '1' to the third value is set as the flipping function value FFV, and that, when the result of the modulo-2 operation is '0', a value obtained by subtracting '1' from the third value is set as the flipping function value FFV. Therefore, the flipping function value FFV is an integer within the range $[-(D+1), D+1]$.

When the degree D of the variable node 1200 satisfies $2^{(q-1)}-2<D\leq 2^q-2$, the flipping function value FFV is an integer within the range $[-(2^q-1), 2^q-1]$, which requires q+1 bits in order to represent the flipping function value FFV. Therefore, in order for the flipping function value FFV to be output from the flipping function value generator 1220 to the comparator 1230, q+1 output lines may be required.

The flipping threshold value Fth may be selected from the range of the flipping function value FFV Therefore, the flipping threshold value Fth may be an integer within the range $[-(2^q-1), 2^q-1]$, which requires at most q+1 bits in order to represent the flipping threshold value Fth. Therefore, in order for the flipping threshold value Fth to be output from the second storage 1240 to the comparator 1230, at most q+1 output lines may be required.

In this embodiment, the comparator 1230 may require q+1 input ports for receiving the flipping function value FFV and q+1 input ports for receiving the flipping threshold value Fth.

FIG. 13 is a diagram illustrating the operation of an example flipping function value according to an embodiment of the present disclosure.

In this embodiment, when the degree of the variable node 1200 is D, the flipping function value FFV is an integer within the range [0, D+1]. For an example, when the degree D of the variable node 1200 is 6, the flipping function value FFV is an integer within the range [0, 7]. In another example, when the degree D of the variable node 1200 is 3, the flipping function value FFV is an integer within the range [0, 4].

When the degree D of the variable node 1200 satisfies $2^{(q-1)}-2<D\leq 2^q-2$, the flipping function value FFV is an integer within the range [0, $2^q-1$], which requires q bits in order to represent the flipping function value FFV. For an example, when q is 3, the flipping function value FFV is an integer within the range [0, 7]. Therefore, when q is 3, 3 bits may be required in order to represent the flipping function value FFV.

FIG. 14 is a diagram illustrating the operation of an example flipping function value according to an embodiment of the present disclosure.

In this embodiment, when the degree of the variable node 1200 is D, a flipping function value FFV may be an integer within the range [-(D+1), D+1]. In an example, when the degree D of the variable node 1200 is 6, the flipping function value is an integer within the range [-7, 7]. In another example, when the degree D of the variable node 1200 is 3, the flipping function value is an integer within the range [-4, 4].

When the degree D of the variable node 1200 satisfies $2^{(q-1)}-2<D\leq 2^q-2$, the flipping function value FFV is an integer within the range [-($2^q-1$), $2^q-1$], which requires q+1 bits in order to represent the flipping function value FFV. For example, when q is 3, the flipping function value is an integer within the range [-7, 7]. Therefore, when q is 3, 4 bits may be required in order to represent the flipping function value.

Figure 15:
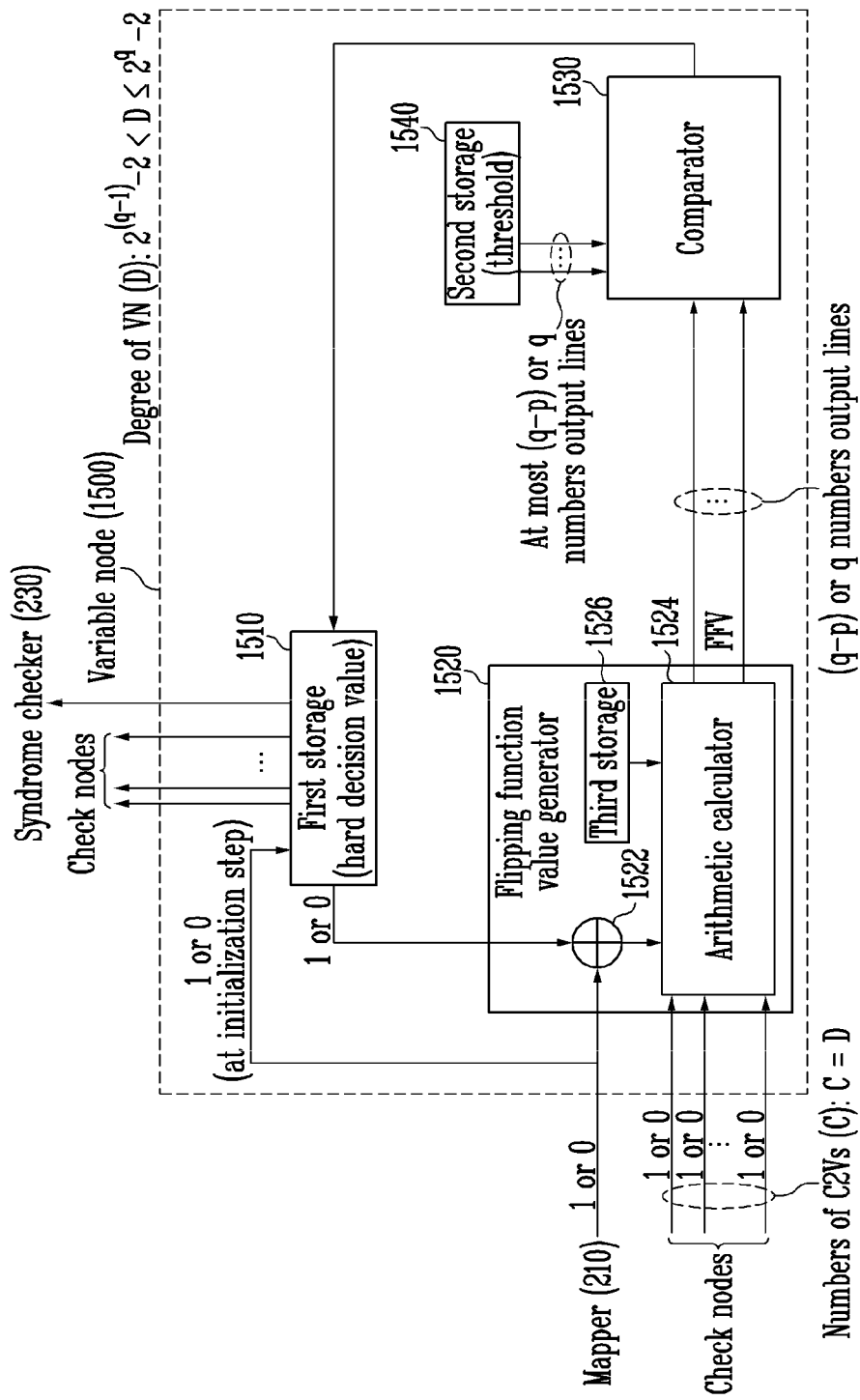
FIG. 15 is a diagram illustrating yet another example of a variable node according to an embodiment of the present disclosure.

FIG. 15 is a diagram illustrating an example variable node according to an embodiment of the present disclosure.

In an example, variable node 1500 in FIG. 15 may be one of the plurality of variable nodes of the variable node update module 222 illustrated in FIG. 1. In some embodiments, all variable nodes in the variable node update module 222 in FIG. 1 may have the same configuration, and perform the same operation, as the variable node 1500 of FIG. 15.

As illustrated in FIG. 15, the variable node 1500 may include a first storage 1510, a flipping function value generator 1520, a comparator 1530, and a second storage 1540.

The first storage 1510 may store a channel value, received from a mapper 210 at an initialization step, as a hard decision value of the variable node 1500.

The first storage 1510 may update a stored hard decision value based on a signal received from the comparator 1530 in each iteration. Updating the hard decision value may mean that the stored hard decision value is maintained without change, or that the stored hard decision value is flipped and stored. Flipping the hard decision value may mean that a value of '0' is changed to '1' or that a value of '1' is changed to '0'. For an example, when a signal instructing the hard decision value to be flipped is received from the comparator 1530, the first storage 1510 may flip and store the stored hard decision value. For another example, when a signal instructing the hard decision value not to be flipped is received from the comparator 1530, the first storage 1510 may maintain the stored hard decision value without change. The updated hard decision value may be provided to a syndrome checker 230 so as to perform a syndrome check.

The variable node 1500 may generate V2C messages and send the generated V2C messages to check nodes coupled to the variable node 1500 in each iteration. In each iteration, the hard decision value stored in the first storage 1510 is transmitted to the check nodes coupled to the variable node 1500. For an example, when a value of '1' is stored, as the hard decision value of the variable node 1500, in the first storage 1510, a value of '1' may be transmitted to all check nodes coupled to the variable node 1500. For another example, when a value of '0' is stored as the hard decision value of the variable node 1500 in the first storage 1510, a value of '0' may be transmitted to all check nodes coupled to the variable node 1500.

The first storage (or memory) 1510 may be implemented as a volatile memory. For example, the first storage 1510 may be implemented as a Static Random Access Memory (SRAM) or a Dynamic Random Access Memory (DRAM), but embodiments of the present disclosure are not limited thereto.

The flipping function value generator 1520 may generate a flipping function value FFV and provide the generated flipping function value FFV to the comparator 1530 in each iteration. In some embodiments, the flipping function value generator 1520 may include a modulo calculator 1522, an arithmetic calculator 1524, and a third storage 1526. The arithmetic calculator 1524 may be implemented as a combinational logic circuit, but embodiments of the present disclosure are not limited thereto.

The modulo calculator 1522 may perform a modulo-2 operation between the channel value received from the mapper 210 and the hard decision value received from the first storage 1510, and may provide the result of the modulo-2 operation to the arithmetic calculator 1524. The result of the modulo-2 operation may be a '0' or '1'. For example, when the channel value received from the mapper 210 and the hard decision value received from the first storage 1510 are equal to each other, the result of the modulo-2 operation may be '0', whereas when the channel value received from the mapper 210 and the hard decision value received from the first storage 1510 are not equal to each other, the result of the modulo-2 operation may be '1'.

In some embodiments, the arithmetic calculator 1524 may generate a flipping function value FFV based on the result of the modulo-2 operation received from the modulo calculator 1522, C2V messages received from check nodes coupled to the variable node 1500, and an offset value stored in the third storage 1526.

In some embodiments, the arithmetic calculator 1524 may generate a flipping function value FFV based on the result of the modulo-2 operation received from the modulo calculator 1522, the C2V messages received from the check nodes coupled to the variable node 1500, and a reference value stored in the third storage 1526.

The comparator 1530 may determine whether to flip the hard decision value stored in the first storage 1510 based on the flipping function value FFV, received from the flipping function value generator 1520, and a flipping threshold value Fth. For an example, when the flipping function value FFV is equal to or greater than the flipping threshold value Fth, the comparator 1530 may determine to flip the hard decision value stored in the first storage 1510. In this case, the comparator 1530 may generate a signal instructing the hard decision value to be flipped and the generated signal to be output to the first storage 1510. For another example, when the flipping function value FFV is less than the flipping threshold value Fth, the comparator 1530 may determine not to flip the hard decision value stored in the first storage 1510. In this case, the comparator 1530 may generate a signal instructing the hard decision value not to be flipped and the generated signal to be output to the first storage 1510.

In accordance with an embodiment, when the flipping function value FFV indicates a set value (e.g., a value of '0' or a reference value), the comparator 1530 may skip a comparison with the flipping threshold value Fth. Therefore, in comparison with the fifth and sixth embodiments, the computational load and power consumption of the comparator 1530 may be reduced. In this case, the comparator 1530 may generate a signal instructing the hard decision value not to be flipped and the generated signal to be output to the first storage 1510. The set value may be stored as a fixed value in the comparator 1530.

The second storage 1540 may store the flipping threshold value Fth. The second storage 1540 may provide the flipping threshold value Fth to the comparator 1530 in each iteration. The second storage 1540 may be implemented as a register, but embodiments of the present disclosure are not limited thereto.

Seventh Embodiment of the Disclosed Technology

In some embodiments, the arithmetic calculator 1524 may generate a fourth value by adding a result of a modulo-2 operation MOD2result received from the modulo calculator 1522 and all values indicated by C2V messages received from the check nodes coupled to the variable node 1500 in each iteration. For example, the arithmetic calculator 1524 may generate the fourth value using the following Equation (9):

$$\text{fourth value} = \text{MOD2result} + \#\text{UCN} \quad (9)$$

The number of C2V messages is equal to the degree D of the variable node 1500, and each of the values of the C2V messages and the result of the modulo-2 operation MOD2result may indicate a value of '0' or '1'. Therefore, the fourth value may be an integer within the range [0, D+1].

In this embodiment, the arithmetic calculator 1524 may also calculate the fourth value by applying a weight to at least one of the number of UCNs (#UCN) or the result of the modulo-2 operation MOD2result. For example, the arithmetic calculator 1524 may generate the fourth value using the following Equation (10). In Equation (10), α and β may be different positive real numbers.

$$\text{fourth value} = [(\alpha \times \text{MOD2result}) + (\beta \times \#\text{UCN})] \quad (10)$$

The arithmetic calculator 1524 may generate the flipping function value FFV by applying the offset value to the fourth value. For example, the arithmetic calculator 1524 may generate the flipping function value FFV using the following Equation (11):

FFV=fourth value−offset value (where, fourth value≥offset value)

$$\text{FFV}=0 \text{ (where, fourth value<offset value)} \quad (11)$$

Equation (11) shows that, when the fourth value is equal to or greater than the offset value, a value obtained by subtracting the offset value from the fourth value is set as the flipping function value FFV, whereas when the fourth value is less than the offset value, '0' is set as the flipping function value FFV.

In some embodiments, the offset value may be a value that is preset (or predetermined) according to the degree D of the variable node 1500.

In some embodiments, when the degree D of the variable node 1500 satisfies $2^{(q-1)}-2<D\leq 2^q-2$, the offset value may be preset such that the flipping function value FFV is represented by fewer than q bits. Here, q may be an integer greater than or equal to 2. For example, the offset value may be preset such that, among values which the flipping function value FFV can have, the largest value is less than or equal to $2^{(q-p)}-1$. This results in the flipping function value being an integer within the range $[0, 2^{(q-p)}-1]$ and the flipping function value being represented by q−p bits.

In an example, p may be a preset (or predetermined) natural number. For example, the offset value may be preset such that, when p is 1, the flipping function value FFV is represented by q−1 bits, and may be preset such that, when p is 2, the flipping function value FFV is represented by q−2 bits. For example, the offset value may be set to any one of natural numbers less than D satisfying the following Equation (12):

$$D-\text{offset value} < 2^{(q-p)} \quad (12)$$

When the flipping function value is an integer within the range $[0, 2^{(q-p)}-1]$, q−p bits may be required in order to represent the flipping function value. Therefore, in order for the flipping function value to be output from the flipping function value generator 1520 to the comparator 1530, q−p output lines may be required.

Thus, in accordance with this embodiment, the number of output lines for outputting the flipping function value FFV may be decreased by p in comparison with the fifth embodiment.

In some embodiments, the flipping threshold value Fth may be selected from the range of the flipping function value. Therefore, the flipping threshold value Fth may be an integer within the range $[0, 2^{(q-p)}-1]$, which requires at most (q−p) bits in order to represent the flipping threshold value Fth. Therefore, in order for the flipping threshold value Fth to be output from the second storage 1540 to the comparator 1530, at most q−p output lines may be required.

In this embodiment, the number of output lines for outputting the flipping threshold value Fth may be decreased by at least p in comparison with the fifth embodiment.

In this embodiment, the comparator 1530 may require q−p input ports for receiving the flipping function value FFV and at most q−p input ports for receiving the flipping threshold value Fth. Therefore, in comparison with the fifth embodiment, the size, hardware complexity, and computational load of the comparator 1530 may be reduced.

Eighth Embodiment of the Disclosed Technology

In some embodiments, the arithmetic calculator 1524 may generate, as a fifth value, the difference between the number of UCNs (#UCN) coupled to the variable node 1500 and the number of SCNs (#SCN) coupled to the variable node 1500. For example, the arithmetic calculator 1524 may generate the fifth value using the following Equation (13):

$$\text{fifth value}=\#\text{UCN}-\#\text{SCN} \quad (13)$$

In other words, the arithmetic calculator 1524 may generate the fifth value by changing all values of '0', among values indicated by the C2V messages, to '−1', and then adding the values indicated by the C2V messages. When the number of UCNs (#UCN) is D, the number of SCNs (#SCN) is 0, whereas when the number of UCNs (#UCN) is 0, the number of SCNs (#SCN) is D, and thus the fifth value may be an integer within the range [−D, D].

In some embodiments, the arithmetic calculator 1524 may generate a sixth value by applying the result of a modulo-2 operation MOD2result received from the modulo calculator 1522 to the fifth value. For example, the arithmetic calculator 1524 may generate the sixth value using the following Equation (14):

sixth value=fifth value+1 (where, MOD2result=1)

sixth value=fifth value−1 (where, MOD2result=0)   (14)

Equation (14) shows that, when the result of the modulo-2 operation is '1', the sixth value is generated by adding '1' to the fifth value, whereas when the result of the modulo-2 operation is '0', the sixth value is generated by subtracting '1' from the fifth value. Therefore, the sixth value may be an integer within the range [−(D+1), D+1].

In this embodiment, the arithmetic calculator 1524 may also calculate the sixth value by applying a weight to at least one of the number of UCNs (#UCN), the number of SCNs (#SCN), or the result of the modulo-2 operation MOD2result. For example, the arithmetic calculator 1524 may generate the sixth value using the following Equation (15). In Equation (15), $\alpha$, $\beta$, and $\gamma$ may be different positive real numbers.

sixth value=[($\alpha$×#UCN)−($\beta$×#SCN)+$\gamma$] (where, MOD2result=1)

sixth value=[($\alpha$×#UCN)−($\beta$×#SCN)−$\gamma$] (where, MOD2result=0)   (15)

The arithmetic calculator 1524 may generate the flipping function value based on the sixth value and a reference value. For example, the arithmetic calculator 1524 may generate the flipping function value FFV using the following Equation (16):

FFV=sixth value (where, sixth value≥reference value)

FFV=0 (where, sixth value<reference value)   (16)

Equation (16) shows that, when the sixth value is equal to or greater than the reference value, the sixth value is set as the flipping function value FFV, whereas when the sixth value is less than the reference value, '0' is set as the flipping function value FFV.

The integer reference value may be selected from the range of [−(D+1), D+1], and may be, for example, '0'. Hereinafter, a description will be made on the assumption that the reference value is '0'.

In an embodiment, when the degree D of the variable node 1500 satisfies $2^{(q-1)}-2<D\leq 2^q-2$, the flipping function value is an integer within the range [0, $2^q-1$]. In an example, q may be an integer greater than or equal to 2. This means that q bits are required in order to represent the flipping function value FFV. Therefore, in order for the flipping function value FFV to be output from the flipping function value generator 1520 to the comparator 1530, q output lines may be required.

Thus, in this embodiment, the number of output lines for outputting the flipping function value FFV may be decreased by 1 in comparison with the sixth embodiment.

The flipping threshold value Fth may be selected from the range of the flipping function value FFV. Therefore, the flipping threshold value Fth may be an integer within the range [0, $2^q-1$], which requires at most q bits in order to represent the flipping threshold value Fth. Therefore, in order for the flipping threshold value Fth to be output from the second storage 1540 to the comparator 1530, at most q output lines may be required.

In this embodiment, the number of output lines for outputting the flipping threshold value Fth may be decreased by at least 1 in comparison with the sixth embodiment.

In this embodiment, the comparator 1530 may require q input ports for receiving the flipping function value FFV and at most q input ports for receiving the flipping threshold value Fth. Therefore, in comparison with the sixth embodiment, the size, hardware complexity, and computational load of the comparator 1530 may be reduced.

In this embodiment, the arithmetic calculator 1524 may also generate the sixth value using the following Equation (17):

sixth value=fifth value+2 (where, MOD2result=1)

sixth value=fifth value (where, MOD2result=0)   (17)

When the sixth value is calculated for the variable node 1500, the degree D of which satisfies $2^{(q-1)}-2<D\leq 2^q-2$, based on Equation (17), the flipping function value FFV calculated based on Equation (16) may be an integer within the range [0, $2^q$]. When the flipping function value FFV is calculated using Equations (16) and (17), there may occur a case where q+1 bits are required in order to represent the flipping function value FFV (e.g., a case where the degree of the variable node 1500 is $2^q-2$ and no SCNs are coupled to the variable node 1500 and where the result of the modulo-2 operation MOD2result is '1'). However, even in this case, an operation of comparing the flipping function value FFV indicating a set value (e.g., a reference value) with the flipping threshold value Fth may be skipped in the comparator 1530, and thus the computational load and power consumption of the comparator 1530 may be reduced.

FIG. 16 is a diagram illustrating the operation of an example flipping function value and an offset value according to an embodiment of the present disclosure.

In this embodiment, the offset value may be set according to the degree D of the variable node 1500. For example, when the degree D of the variable node 1500 satisfies $2^{(q-1)}-2<D\leq 2^q-2$, the offset value may be set to a larger value as the degree D of the variable node 1500 is higher, whereas the offset value may be set to a smaller value as the degree D of the variable node 1500 is lower. As illustrated in FIG. 16, when q is 4, 3, or 2, the offset value is set to a larger value as the degree D of the variable node is higher.

When the degree of the variable node 1500 satisfies $2^{(q-1)}-2<D\leq 2^q-2$, the offset value may be set such that, among values which the flipping function value FFV can have, the largest value is less than or equal to $2^{(q-p)}-1$. This means that the offset value may be preset such that the flipping function value FFV is represented by q−p bits. Here, p may be a natural number less than q.

In some embodiments, when the degree of the variable node 1500 satisfies $2^{(q-1)}-2<D\leq 2^q-2$, the flipping function value is an integer within the range [0, $2^{(q-p)}-1$], which requires (q−p) bits in order to represent the flipping function value FFV For an example, when p is 1 and q is 3, the flipping function value FFV is an integer within the range [0, 3]. In this case, 2 bits may be required in order to represent the flipping function value FFV. For another example, when p is 2 and q is 3, the flipping function value is an integer within the range [0, 1]. In this case, 1 bit may be required in order to represent the flipping function value FFV In this embodiment, the number of bits required in order to represent the flipping function value FFV may be decreased by p in comparison with the fifth embodiment, described above with reference to FIG. 13.

FIG. 17 is a diagram illustrating the operation of an example flipping function value and a reference value according to an embodiment of the present disclosure.

In this embodiment, the integer reference value may be selected from the range [−D, D] when the degree of a variable node is D, and a case where a reference value is '0' is illustrated as an example in FIG. 17.

When the degree of the variable node 1500 is D, the flipping function value FFV may be an integer within the range [0, D+1]. For an example, when the degree D of the variable node 1500 is 6, the flipping function value FFV may be an integer within the range [0, 7]. For another example, when the degree D of the variable node 1500 is 3, the flipping function value is an integer within the range [0, 4].

When the degree D of the variable node 1500 satisfies $2^{(q-1)}-2 < D \leq 2^q-2$, the flipping function value FFV may be an integer within the range $[0, 2^{(q-1)}]$, which requires q bits in order to represent the flipping function value FFV. For example, when q is 3, the flipping function value FFV is an integer within the range [0, 7]. Therefore, when q is 3, 3 bits may be required in order to represent the flipping function value.

In this embodiment, the number of bits required in order to represent the flipping function value FFV may be decreased by 1 in comparison with the sixth embodiment, described above with reference to FIG. 14.

Figure 18:
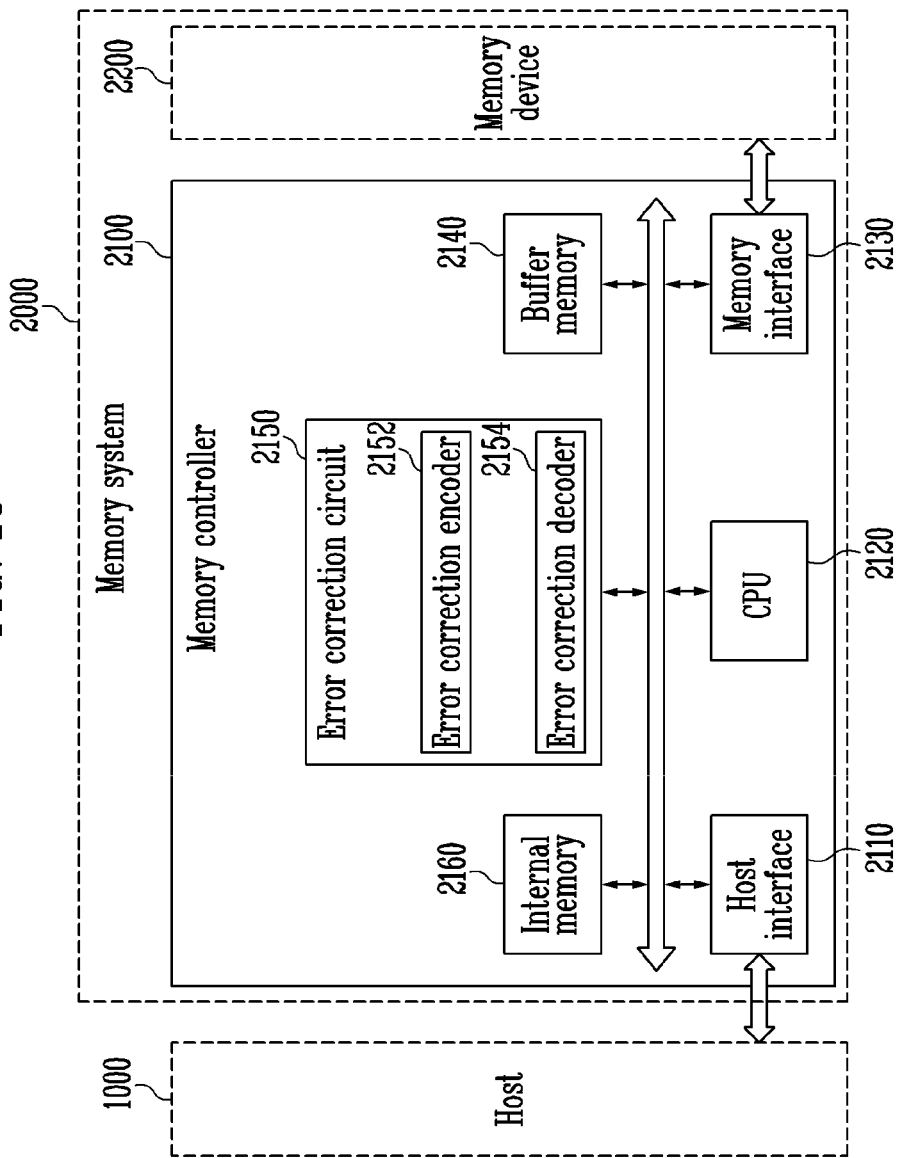
FIG. 18 is a diagram illustrating a memory system according to an embodiment of the present disclosure.

FIG. 18 is a diagram illustrating a memory system according to an embodiment of the present disclosure.

As illustrated in FIG. 18, a memory system 2000 may include a memory device 2200 which stores data, and a memory controller 2100 which controls the memory device 2200 in response to a request received from a host 1000.

The host 1000 may be a device or a system which stores data in the memory system 2000 or retrieves data from the memory system 2000. For example, the host 1000 may include at least one of a computer, a portable digital device, a tablet, a digital camera, a digital audio player, a television, a wireless communication device, or a cellular phone, but embodiments of the present disclosure are not limited thereto.

The memory controller 2100 may control the overall operation of the memory system 2000. The memory controller 2100 may perform various operations in response to requests received from the host 1000. For example, the memory controller 2100 may perform a program operation, a read operation, an erase operation, etc. on the memory device 2200. During a program operation, the memory controller 2100 may transmit a program command, an address, a codeword, etc. to the memory device 2200. During a read operation, the memory controller 2100 may transmit a read command, an address, etc. to the memory device 2200, and may receive read data corresponding to a codeword from the memory device 2200. During an erase operation, the memory controller 2100 may transmit an erase command, an address, etc. to the memory device 2200.

The memory controller 2100 may include a host interface 2110, a central processing unit (CPU) 2120, a memory interface 2130, a buffer memory 2140, an error correction circuit 2150, and an internal memory 2160. The host interface 2110, the memory interface 2130, the buffer memory 2140, the error correction circuit 2150, and the internal memory 2160 may be controlled by the CPU 2120.

The host interface 2110 may transfer a program request, a read request, and an erase request, which are received from the host 1000, to the CPU 2120. During a program operation, the host interface 2110 may receive original data, corresponding to the program request, from the host 1000, and may store the received original data in the buffer memory 2140. During a read operation, the host interface 2110 may transmit a decoded codeword, stored in the buffer memory 2140, to the host 1000. The host interface 2110 may communicate with the host 1000 using various interface protocols. For example, the host interface 2110 may communicate with the host 1000 using at least one of interface protocols, such as Non-Volatile Memory express (NVMe), Peripheral Component Interconnect-Express (PCI-E), Advanced Technology Attachment (ATA), Serial ATA (SATA), Parallel ATA (PATA), Universal Serial Bus (USB), Multi-Media Card (MMC), Enhanced Small Disk Interface (ESDI), Integrated Drive Electronics (IDE), Mobile Industry Processor Interface (MIPI), Universal Flash Storage (UFS), Small Computer System Interface (SCSI), or serial attached SCSI (SAS), but embodiments of the present disclosure are not limited thereto.

The CPU 2120 may perform various types of calculations (operations) or generate commands and addresses so as to control the memory device 2200. For example, the CPU 2120 may generate various commands and addresses required for a program operation, a read operation, and an erase operation in response to requests received from the host interface 2110.

When the program request is received from the host interface 2110, the CPU 2120 may control the error correction circuit 2150 so that error correction encoding is performed on the original data stored in the buffer memory 2140. When notification that a codeword has been generated is received from the error correction circuit 2150, the CPU 2120 may control the memory interface 2130 so that the program command, the address, and the codeword stored in the buffer memory 2140 are transmitted to the memory device 2200.

When the read request is received from the host interface 2110, the CPU 2120 may control the memory interface 2130 so that the read command and the address are transmitted to the memory device 2200. When notification that the read data has been received is received from the memory interface 2130, the CPU 2120 may control the error correction circuit 2150 so that error correction decoding is performed on the read data stored in the buffer memory 2140. When notification that a decoded codeword has been generated is received from the error correction circuit 2150, the CPU 2120 may control the host interface 2110 so that the decoded codeword stored in the buffer memory 2140 is transmitted to the host 1000.

The memory interface 2130 may communicate with the memory device 2200 using various interface protocols.

During a program operation, the memory interface 2130 may transmit the program command and the address, received from the CPU 2120, and the codeword, stored in the buffer memory 2140, to the memory device 2200.

During a read operation, the memory interface 2130 may transmit the read command and the address, received from the CPU 2120, to the memory device 2200. During the read operation, the memory interface 2130 may store read data, received from the memory device 2200, in the buffer memory 2140, and may notify the CPU 2120 that the read data has been received.

The buffer memory 2140 may temporarily store data while the memory controller 2100 controls the memory device 2200.

During the program operation, the buffer memory 2140 may store the original data received from the host interface 2110 and transmit the stored original data to the error correction circuit 2150. During a program operation, the buffer memory 2140 may store the codeword received from the error correction circuit 2150, and may transmit the stored codeword to the memory interface 2130.

During the read operation, the buffer memory 2140 may store the read data received from the memory device 2200 and transmit the stored read data to the error correction circuit 2150. During the read operation, the buffer memory 2140 may store the decoded codeword received from the error correction circuit 2150, and may transmit the stored decoded codeword to the host interface 2110.

The error correction circuit 2150 may perform error correction encoding on the original data, and may perform error correction decoding on the read data. The error correction circuit 2150 may have error correction capability at a predetermined level. For example, when a number of error bits that do not exceed the error correction capability are present in the read data, the error correction circuit 2150 may detect and correct the error included in the read data. The maximum number of error bits that do not exceed the error correction capability of the error correction circuit 2150 may be regarded as the maximum allowable number of error bits. The error correction circuit 2150 may be an error correction circuit using an LDPC code.

The error correction circuit 2150 may include an error correction encoder 2152 and an error correction decoder 2154.

The error correction encoder 2152 may generate a codeword by performing error correction encoding on the original data received from the buffer memory 2140. The error correction encoder 2152 may transmit the generated codeword to the buffer memory 2140, and may notify the CPU 2120 that the codeword has been generated. The basic configuration and operation of the error correction encoder 2152 may be identical to those of an error correction encoder 100, described above with reference to FIG. 1.

The error correction decoder 2154 may generate a decoded codeword by performing error correction decoding on the read data received from the buffer memory 2140. The error correction encoder 2154 may transmit the decoded codeword to the buffer memory 2140, and may notify the CPU 2120 that the decoded codeword has been generated. When the error included in the read data cannot be corrected, the error correction decoder 2154 may notify the CPU 2120 that error correction decoding has failed. The basic configuration and operation of the error correction decoder 2154 may be identical to those of an error correction decoder 200, described above with reference to FIG. 1.

The internal memory 2160 may be used as a storage which stores various types of information required for the operation of the memory controller 2100. The internal memory 2160 may store a plurality of tables. For example, the internal memory 2160 may store an address mapping table in which logical addresses are mapped to physical addresses.

The memory device 2200 may perform a program operation, a read operation, an erase operation, etc. under the control of the memory controller 2100. The memory device 2200 may be implemented as a volatile memory device in which stored data is lost when the supply of power is interrupted or as a nonvolatile memory device in which stored data is retained even when the supply of power is interrupted.

The memory device 2200 may receive the program command, the address, and the codeword from the memory controller 2100, and may store the codeword in response to the program command and the address. The codeword may be stored in a memory block, selected from among a plurality of memory blocks included in the memory device 2200, in response to the program command and the address. The memory blocks may be classified into a user block in which user data is stored and a metablock in which data required for the internal operation of the memory system 2000 is stored. Each codeword may be stored in memory cells (e.g., memory cells constituting a single page) included in the user block.

The memory device 2200 may perform a read operation in response to the read command and the address received from the memory controller 2100, and may provide read data to the memory controller 2100.

Figure 19:
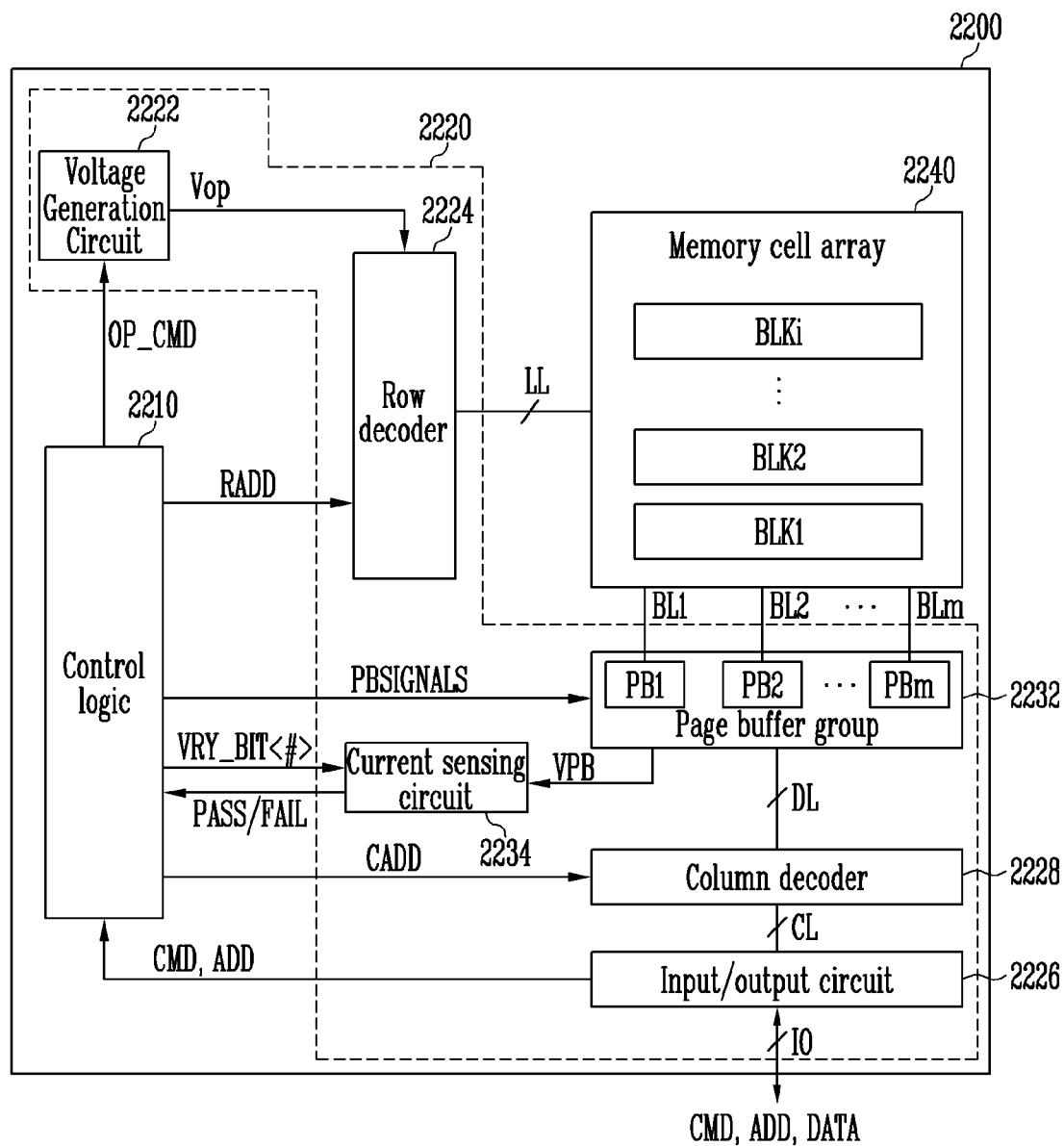
FIG. 19 is a diagram illustrating a memory device according to an embodiment of the present disclosure.

FIG. 19 is a diagram illustrating a memory device according to an embodiment of the present disclosure. The memory device illustrated in FIG. 19 may be applied to the memory system illustrated in FIG. 18.

The memory device 2200 may include a control logic 2210, peripheral circuits 2220 and a memory cell array 2240. The peripheral circuits 2220 may include a voltage generation circuit 2222, a row decoder 2224, an input/output circuit 2226, a column decoder 2228, a page buffer group 2232, and a current sensing circuit 2234.

The control logic 2210 may control the peripheral circuits 2220 under the control of the memory controller 2100 of FIG. 18.

The control logic 2210 may control the peripheral circuits 2220 in response to a command CMD and an address ADD that are received from the memory controller 2100 through the input/output circuit 2226. For example, the control logic 2210 may output an operation signal OP_CMD, a row address RADD, a column address CADD, page buffer control signals PBSIGNALS, and an enable bit VRY_BIT<#> in response to the command CMD and the address ADD. The control logic 2210 may determine whether a verify operation has passed or failed in response to a pass or fail signal PASS or FAIL received from the current sensing circuit 2234.

The peripheral circuits 2220 may perform a program operation of storing data in the memory cell array 2240, a read operation of outputting data stored in the memory cell array 2240, and an erase operation of erasing data stored in the memory cell array 2240.

The voltage generation circuit 2222 may generate various operating voltages Vop that are used for the program, read, and erase operations in response to the operation signal OP_CMD received from the control logic 2210. For example, the voltage generation circuit 2222 may transfer a program voltage, a verify voltage, a pass voltage, a read voltage, an erase voltage, a turn-on voltage, etc. to the row decoder 2224.

The row decoder 2224 may transfer the operating voltages Vop to local lines LL that are coupled to a memory block selected from among memory blocks included in the memory cell array 2240 in response to the row address RADD received from the control logic 2210. The local lines LL may include local word lines, local drain select lines, and local source select lines. In addition, the local lines LL may include various lines, such as source lines, coupled to memory blocks.

The input/output circuit 2226 may transfer the command CMD and the address ADD, received from the memory controller through input/output (IO) lines, to the control logic 2210, or may exchange data with the column decoder 2228.

The column decoder 2228 may transfer data between the input/output circuit 2226 and the page buffer group 2232 in response to a column address CADD received from the control logic 2210. For example, the column decoder 2228 may exchange data with page buffers PB1 to PBm through data lines DL or may exchange data with the input/output circuit 2226 through column lines CL.

The page buffer group 2232 may be coupled to bit lines BL1 to BLm coupled in common to the memory blocks BLK1 to BLKi. The page buffer group 2232 may include a plurality of page buffers PB1 to PBm coupled to the bit lines BL1 to BLm, respectively. For example, one page buffer may be coupled to each bit line. The page buffers PB1 to PBm may be operated in response to the page buffer control signals PB SIGNALS received from the control logic 2210. For example, during a program operation, the page buffers PB1 to PBm may temporarily store program data (e.g., codeword) received from the memory controller, and may control voltages to be applied to the bit lines BL1 to BLm based on the program data. Also, during a read operation, the page buffers PB1 to PBm may temporarily store data received through the bit lines BL1 to BLm or may sense voltages or currents of the bit lines BL1 to BLm.

During a read operation or a verify operation, the current sensing circuit 2234 may generate a reference current in response to the enable bit VRY_BIT<#> received from the control logic 2210, and may compare a reference voltage, generated by the reference current, with a sensing voltage VPB, received from the page buffer group 2232, and then output a pass signal PASS or a fail signal FAIL.

The memory cell array 2240 may include a plurality of memory blocks BLK1 to BLKi in which data is stored. In the memory blocks BLK1 to BLKi, user data and various types of information required for the operation of the memory device 2200 may be stored. The memory blocks BLK1 to BLKi may each be implemented as a two-dimensional (2D) structure or a three-dimensional (3D) structure, and may be equally configured.

Figure 20:
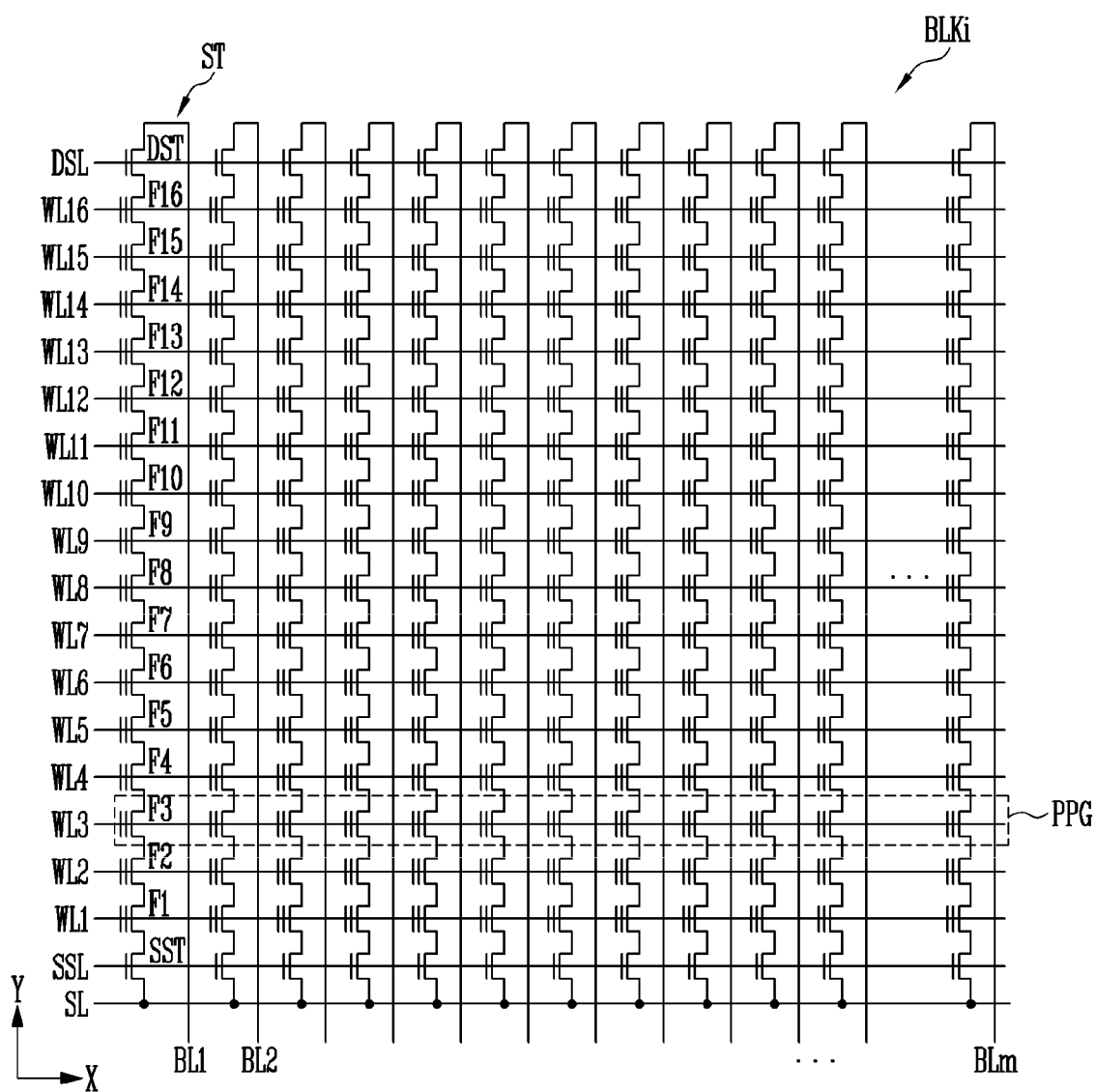
FIG. 20 is an example diagram illustrating a memory block.

FIG. 20 is an example diagram illustrating a memory block.

A memory cell array may include a plurality of memory blocks, and any one memory block BLKi of the plurality of memory blocks is illustrated in FIG. 20 for convenience of description.

A plurality of word lines arranged in parallel to each other between a first select line and a second select line may be coupled to the memory block BLKi. Here, the first select line may be a source select line SSL, and the second select line may be a drain select line DSL. In detail, the memory block BLKi may include a plurality of strings ST coupled between bit lines BL1 to BLm and a source line SL. The bit lines BL1 to BLm may be coupled to the strings ST, respectively, and the source line SL may be coupled in common to the strings ST. The strings ST may be equally configured, and thus the string ST coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. A single string ST may include at least one source select transistor SST and at least one drain select transistor DST, and more memory cells than the memory cells F1 to F16 illustrated in the drawing may be included in the string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST included in different strings ST may be coupled to the drain select line DSL, and gates of the memory cells F1 to F16 may be coupled to a plurality of word lines WL1 to WL16, respectively. A group of memory cells coupled to the same word line, among the memory cells included in different strings ST, may be referred to as a "physical page: PPG". Therefore, the memory block BLKi may include a number of physical pages PPG identical to the number of word lines WL1 to WL16.

One memory cell may store one bit of data. This cell is called a single-level cell (SLC). Here, one physical page PPG may store data corresponding to one logical page LPG. The data corresponding to one logical page LPG may include a number of data bits identical to the number of cells included in one physical page PPG. For example, when two or more bits of data are stored in one memory cell, one physical page PPG may store data corresponding to two or more logical pages LPG. For example, in a memory device driven in an MLC type, data corresponding to two logical pages may be stored in one physical page PPG. In a memory device driven in a TLC type, data corresponding to three logical pages may be stored in one physical page PPG.

Figure 21:
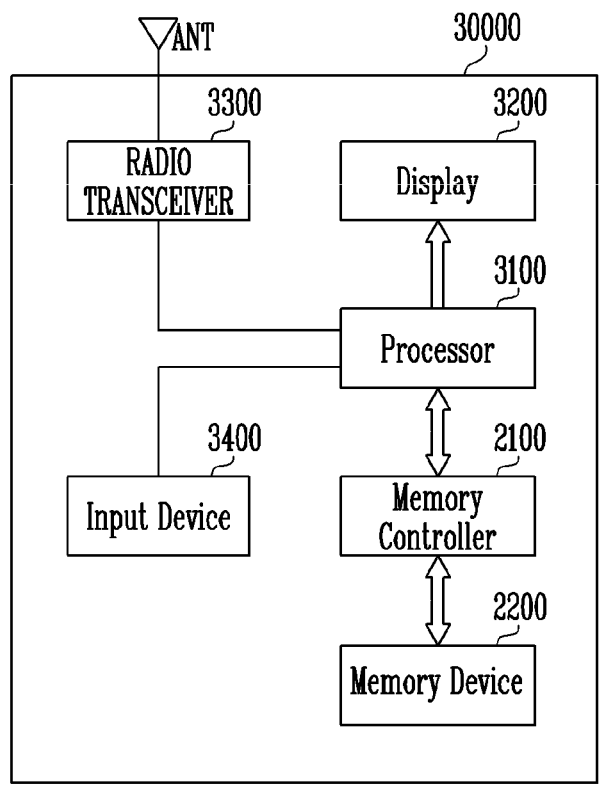
FIGS. 21 and 22 are diagrams illustrating embodiments of a memory system including a memory controller of FIG. 18.

FIG. 21 is a diagram illustrating an embodiment of a memory system including the memory controller of FIG. 18.

Referring to FIG. 21, a memory system 30000 may be implemented as a cellular phone, a smartphone, a tablet, a personal computer (PC), a personal digital assistant (PDA) or a wireless communication device. The memory system 30000 may include a memory device 2200 and a memory controller 2100 that is capable of controlling the operation of the memory device 2200.

The memory controller 2100 may control the operation of the memory device 2200, e.g., a program operation, an erase operation or a read operation, under the control of a processor 3100.

Data programmed in the memory device 2200 may be output through a display 3200 under the control of the memory controller 2100.

A radio transceiver 3300 may send and receive radio signals through an antenna (ANT). For example, the radio transceiver 3300 may change a radio signal received through the antenna into a signal which may be processed by the processor 3100. Therefore, the processor 3100 may process a signal output from the radio transceiver 3300 and transmit the processed signal to the memory controller 2100 or the display 3200. The memory controller 2100 may transmit a signal processed by the processor 3100 to the memory device 2200. Furthermore, the radio transceiver 3300 may change a signal output from the processor 3100 into a radio signal, and output the changed radio signal to the external device through the antenna. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data output from the memory controller 2100, data output from the radio transceiver 3300, or data output from the input device 3400 is output through the display 3200.

In an embodiment, the memory controller 2100 capable of controlling the operation of the memory device 2200 may be implemented as a part of the processor 3100 or as a chip provided separately from the processor 3100.

Figure 22:
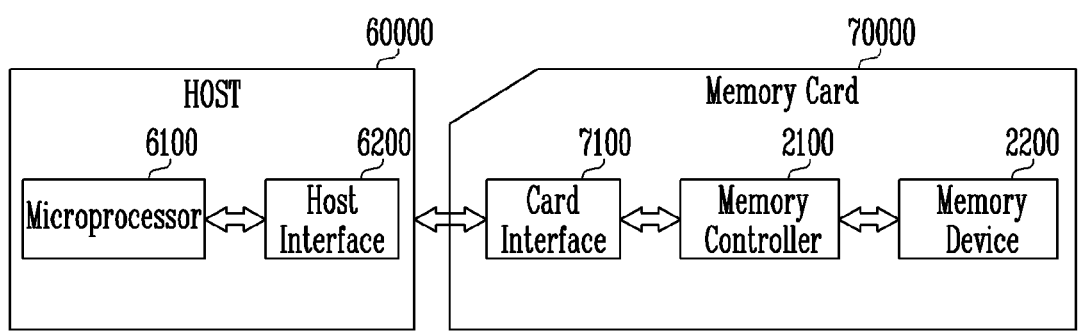

FIG. 22 is a diagram illustrating an embodiment of a memory system including the memory controller of FIG. 18.

Referring to FIG. 22, a memory system 70000 may be embodied in a memory card or a smart card. The memory system 70000 may include a memory device 2200, a memory controller 2100, and a card interface 7100.

The memory controller 2100 may control data exchange between the memory device 2200 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 2100 according to a protocol of the host 60000. In an embodiment, the card interface 7100 may support a universal serial bus (USB) protocol, and an interchip (IC)-USB protocol. Here, the card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet, a digital camera, a digital audio player, a cellular phone, console video game hardware or a digital set-top box, the host interface 6200 may perform data communication with the memory device 2200 through the card interface 7100 and the memory controller 2100 under the control of a microprocessor 6100.

In accordance with the present disclosure, hardware complexity of the error correction decoder and the memory system having the error correction decoder may be improved.

In accordance with the present disclosure, power consumption of the error correction decoder and the memory system having the error correction decoder may be reduced.

While the disclosed technology has been shown and described with reference to certain exemplary embodiments thereof, it will be understood by those skilled in the art that various changes in form and details may be made therein without departing from the spirit and scope of the disclosed technology as defined by the appended claims and their equivalents. Therefore, the scope of the disclosed technology should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the disclosed technology, and the disclosed technology is not limited thereto. That is, it should be apparent to those skilled in the art that various modifications can be made on the basis of the technological scope of the disclosed technology.

Meanwhile, the exemplary embodiments of the disclosed technology have been described in the drawings and specification. Although specific terminologies are used here, those are only to explain the embodiments of the disclosed technology. Therefore, the disclosed technology is not restricted to the above-described embodiments and many variations are possible within the spirit and scope of the disclosed technology. It should be apparent to those skilled in the art that various modifications can be made on the basis of the technological scope of the disclosed technology in addition to the embodiments disclosed herein.

What is claimed is:

1. An error correction decoder for improving an error correction decoder performance using an iterative decoding scheme, comprising:
    a memory configured to store a hard decision value of a variable node;
    a flipping function value generator configured to generate, in an i-th iteration, a first value based on a difference between a number of unsatisfied check nodes (UCNs) corresponding to the variable node and a number of satisfied check nodes (SCNs) corresponding to the variable node, and generate a flipping function value by selectively updating the first value based on a comparison of the first value to a reference value; and
    a comparator configured to output, in the i-th iteration, a first signal indicating whether to flip or not flip the hard decision value of the variable node in the memory based on comparing the flipping function value to a flipping threshold value.

2. The error correction decoder according to claim 1, wherein the flipping function value generator is configured to:
    upon a determination that the first value is equal to or greater than the reference value, generate the first value as the flipping function value, and
    upon a determination that the first value is less than the reference value, generate the reference value as the flipping function value.

3. The error correction decoder according to claim 1, wherein:
    the comparator is further configured to output, upon a determination that the flipping function value is equal to or greater than the flipping threshold value, a second signal indicating that the hard decision value of the variable node in the memory be flipped, and
    the memory is further configured to flip, upon receiving the second signal from the comparator, the hard decision value of the variable node and store a flipped hard decision value.

4. The error correction decoder according to claim 3, further comprising:
    a syndrome checker configured to perform a syndrome check corresponding to the i-th iteration using the flipped hard decision value, and to output a decoded codeword including the flipped hard decision value upon a determination that the syndrome check has passed.

5. The error correction decoder according to claim 1, wherein
    the flipping function value generator is configured to generate a value, obtained by subtracting the number of SCNs from the number of UCNs, as the first value, and
    wherein the flipping function value is generated to have a value that is equal to or greater than the reference value and is less than or equal to $2^q-1$ (where q is a natural number of 2 or more) in accordance with the variable node, a degree of which is greater than $2^{(q-1)}-1$ and is less than or equal to $2^q-1$.

6. The error correction decoder according to claim 5, wherein the flipping function value is represented by q bits and is transmitted from the flipping function value generator to the comparator through q output lines.

7. The error correction decoder according to claim 1, wherein the flipping function value generator further comprises:
a modulo calculator configured to generate a second value by performing a modulo-2 operation between a channel value corresponding to the variable node and the hard decision value of the variable node, stored in the memory; and
an arithmetic calculator configured to generate, upon a determination that the second value is 1, the first value by adding 1 to a value, obtained by subtracting the number of SCNs from the number of UCNs, and upon a determination that the second value is 0, generate the first value by adding −1 to the value, obtained by subtracting the number of SCNs from the number of UCNs,
wherein the flipping function value is generated to have a value that is equal to or greater than the reference value and is less than or equal to $2^q-1$ in accordance with the variable node, a degree of which is greater than $2^{(q-1)}-2$ and is less than or equal to $2^q-2$ (where q is a natural number of 2 or more).

8. The error correction decoder according to claim 7, wherein the flipping function value is represented by q bits and is transmitted from the flipping function value generator to the comparator through q output lines.

9. A memory system, comprising:
a memory device; and
a memory controller including a processor configured to receive read values from the memory device and perform error correction decoding based on an iterative decoding scheme based on the received read values,
wherein the processor comprises:
a memory configured to store a hard decision value of a variable node;
a flipping function value generator configured to generate, in an i-th iteration, a first value based on a difference between a number of unsatisfied check nodes (UCNs) corresponding to the variable node and a number of satisfied check nodes (SCNs) corresponding to the variable node, and generate a flipping function value by selectively updating the first value based on a comparison of the first value to a reference value; and
a comparator configured to output, in the i-th iteration, a signal indicating whether to flip or not flip the hard decision value of the variable node in the memory based on a comparison between the flipping function value and a flipping threshold value.

10. The memory system according to claim 9, wherein the flipping function value generator is configured to generate a value, obtained by subtracting the number of SCNs from the number of UCNs, as the first value, and
wherein the flipping function value is generated to have a value that is equal to or greater than the reference value and is less than or equal to $2^q-1$ (where q is a natural number of 2 or more) in accordance with the variable node, a degree of which is greater than $2^{(q-1)}-1$ and is less than or equal to $2^q-1$.

* * * * *